US011948879B2

(12) United States Patent
Huang et al.

(10) Patent No.: US 11,948,879 B2
(45) Date of Patent: Apr. 2, 2024

(54) SEMICONDUCTOR DEVICE STRUCTURE AND METHODS OF FORMING THE SAME

(71) Applicant: TAIWAN SEMICONDUCTOR MANUFACTURING COMPANY, LTD., Hsinchu (TW)

(72) Inventors: Lin-Yu Huang, Hsinchu (TW); Li-Zhen Yu, New Taipei (TW); Chia-Hao Chang, Hsinchu (TW); Cheng-Chi Chuang, New Taipei (TW); Kuan-Lun Cheng, Hsinchu (TW); Chih-Hao Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 72 days.

(21) Appl. No.: 17/874,886

(22) Filed: Jul. 27, 2022

(65) Prior Publication Data
US 2022/0375850 A1     Nov. 24, 2022

Related U.S. Application Data

(62) Division of application No. 16/935,135, filed on Jul. 21, 2020, now Pat. No. 11,456,246.

(51) Int. Cl.
*H01L 21/768* (2006.01)
*H01L 23/522* (2006.01)
*H01L 23/532* (2006.01)

(52) U.S. Cl.
CPC .... *H01L 23/5222* (2013.01); *H01L 21/76804* (2013.01); *H01L 21/7682* (2013.01); *H01L 21/76834* (2013.01); *H01L 21/76843* (2013.01); *H01L 23/5226* (2013.01); *H01L 23/5329* (2013.01)

(58) Field of Classification Search
CPC ......... H01L 21/76804; H01L 21/76843; H01L 23/5226; H01L 23/5329; H01L 21/76831; H01L 21/76847; H01L 21/76877; H01L 23/53295; H01L 23/5283; H01L 27/0886; H01L 23/5222; H01L 21/7682; H01L 2221/1063
See application file for complete search history.

(56) References Cited

U.S. PATENT DOCUMENTS

| 11,374,093 | B2 | 6/2022 | Huang et al. |
| 2016/0056235 | A1* | 2/2016 | Lee .................. H01L 21/76805 257/522 |

(Continued)

*Primary Examiner* — Thanhha S Pham
(74) *Attorney, Agent, or Firm* — NZ CARR LAW OFFICE

(57) ABSTRACT

A semiconductor device structure, along with methods of forming such, are described. The semiconductor device structure includes a device, a first dielectric material disposed over the device, and an opening is formed in the first dielectric material. The semiconductor device structure further includes a conductive structure disposed in the opening, and the conductive structure includes a first sidewall. The semiconductor device structure further includes a surrounding structure disposed in the opening, and the surrounding structure surrounds the first sidewall of the conductive structure. The surrounding structure includes a first spacer layer and a second spacer layer adjacent the first spacer layer. The first spacer layer is separated from the second spacer layer by an air gap.

20 Claims, 20 Drawing Sheets

(56) References Cited

U.S. PATENT DOCUMENTS

| | | |
|---|---|---|
| 2019/0221475 A1 | 7/2019 | Hong et al. |
| 2020/0020697 A1 | 1/2020 | Kim et al. |
| 2021/0175116 A1 | 6/2021 | Shih |

* cited by examiner

SEMICONDUCTOR DEVICE STRUCTURE AND METHODS OF FORMING THE SAME

CROSS-REFERENCE TO RELATED APPLICATIONS

This application is a divisional application of U.S. patent application Ser. No. 16/935,135 filed Jul. 21, 2020, which is incorporated by reference in its entirety.

BACKGROUND

As the semiconductor industry introduces new generations of integrated circuits (IC) having higher performance and more functionality, the density of the elements forming the ICs increases, while the dimensions, sizes and spacing between components or elements are reduced. In the past, such reductions were limited only by the ability to define the structures photo-lithographically, device geometries having smaller dimensions created new limiting factors. For example, for any two adjacent conductive features, as the distance between the conductive features decreases, the resulting capacitance (a function of the dielectric constant (k value) of the insulating material divided by the distance between the conductive features) increases. This increased capacitance results in increased capacitive coupling between the conductive features, increased power consumption, and an increase in the resistive-capacitive (RC) time constant.

Therefore, there is a need to solve the above problems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-16A are cross-sectional side views of various stages of manufacturing the semiconductor device structure taken along line A-A of FIG. 1, in accordance with some embodiments.

FIGS. 2B-16B are cross-sectional side views of various stages of manufacturing the semiconductor device structure taken along line B-B of FIG. 1, in accordance with some embodiments.

FIGS. 18A-20A are cross-sectional side views of various stages of manufacturing the semiconductor device structure taken along line A-A of FIG. 1, in accordance with some embodiments.

FIGS. 18B-20B are cross-sectional side views of various stages of manufacturing the semiconductor device structure taken along line B-B of FIG. 1, in accordance with some embodiments.

DETAILED DESCRIPTION

Figure 1:
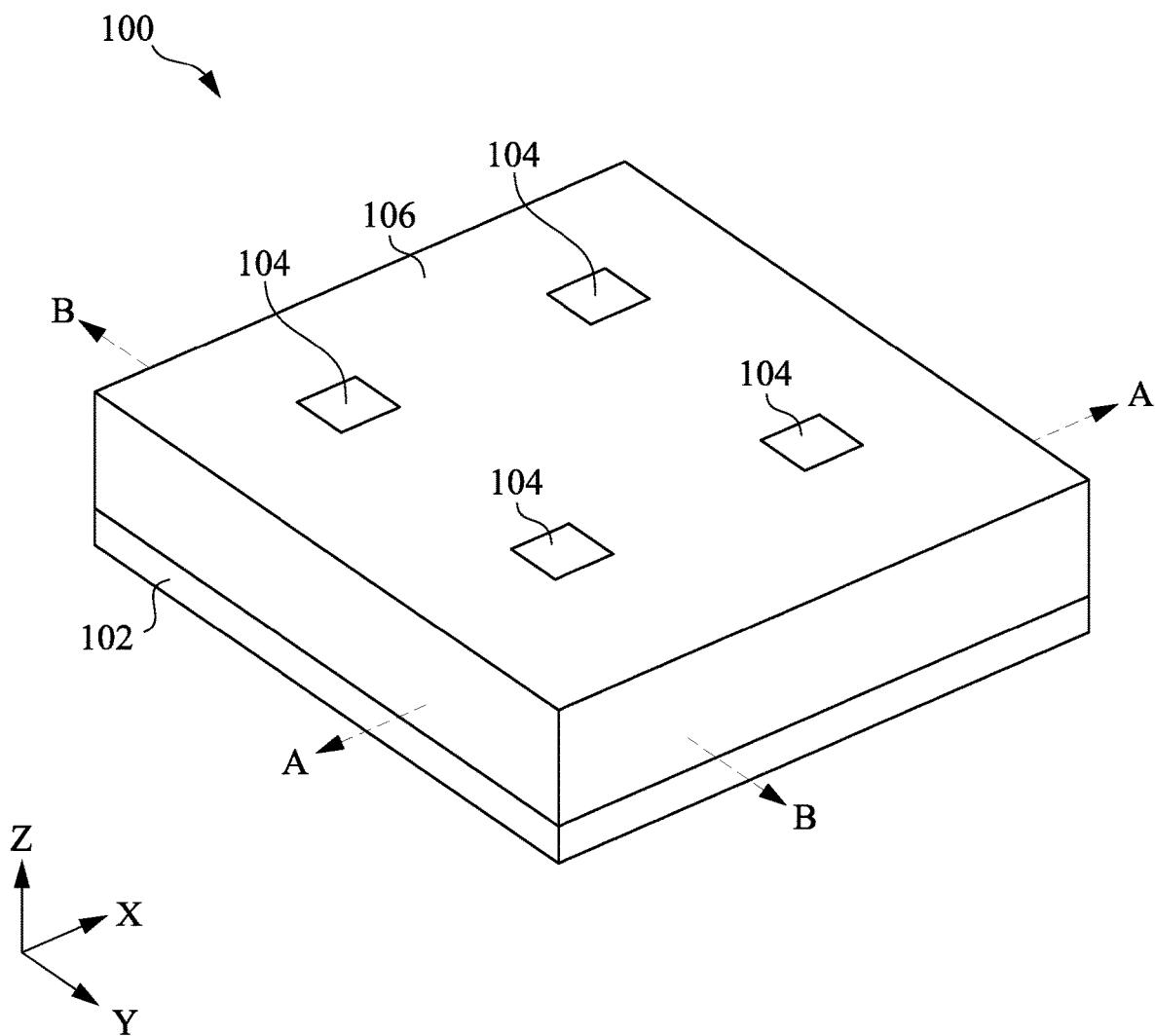
FIG. 1 is a perspective view of one of the various stages of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1-20B show exemplary sequential processes for manufacturing a semiconductor device structure 100, in accordance with some embodiments. It is understood that additional operations can be provided before, during, and after processes shown by FIGS. 1-20B, and some of the operations described below can be replaced or eliminated, for additional embodiments of the process. The order of the operations/processes may be interchangeable.

FIG. 1 is a perspective view of one of the various stages of manufacturing a semiconductor device structure 100, in accordance with some embodiments. As shown in FIG. 1, the semiconductor device structure 100 includes a substrate 102 having at least a plurality of conductive features 104 formed thereover. The conductive features 104 are formed in a dielectric material 106. One or more devices (not shown), such as transistors, diodes, imaging sensors, resistors, capacitors, inductors, memory cells, a combination thereof, and/or other suitable devices, may be formed between the substrate 102 and the conductive features 104.

Figure 2A:
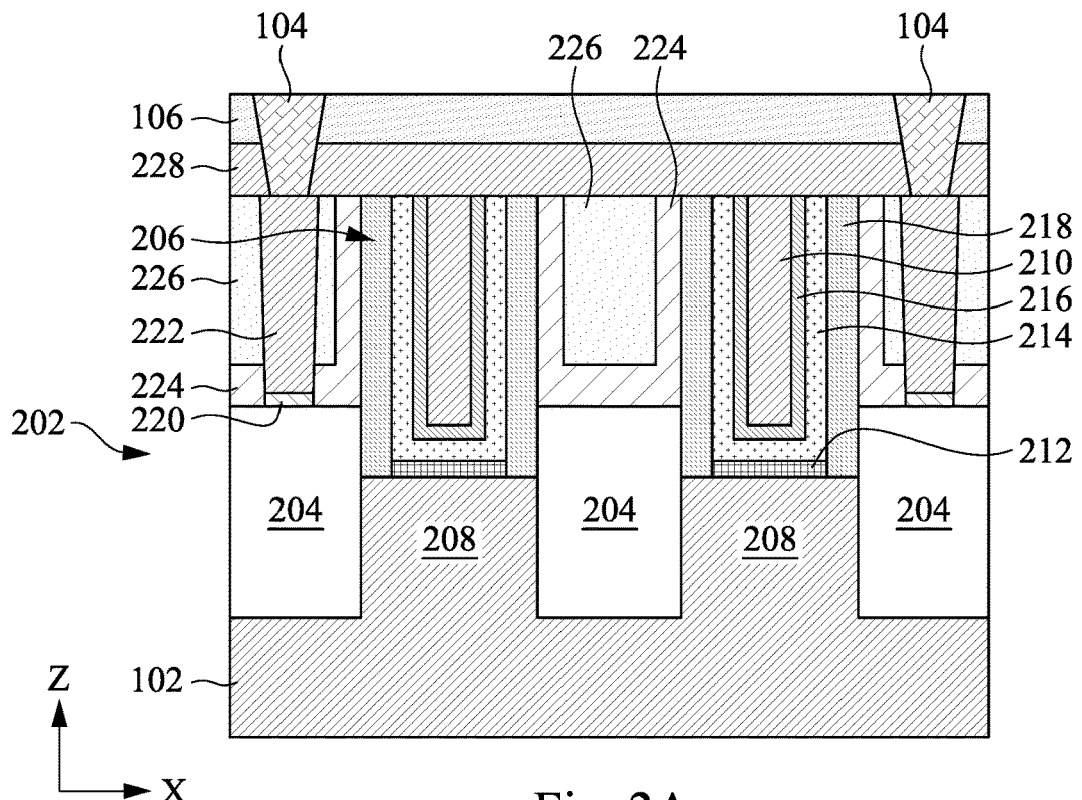
Figure 2B:
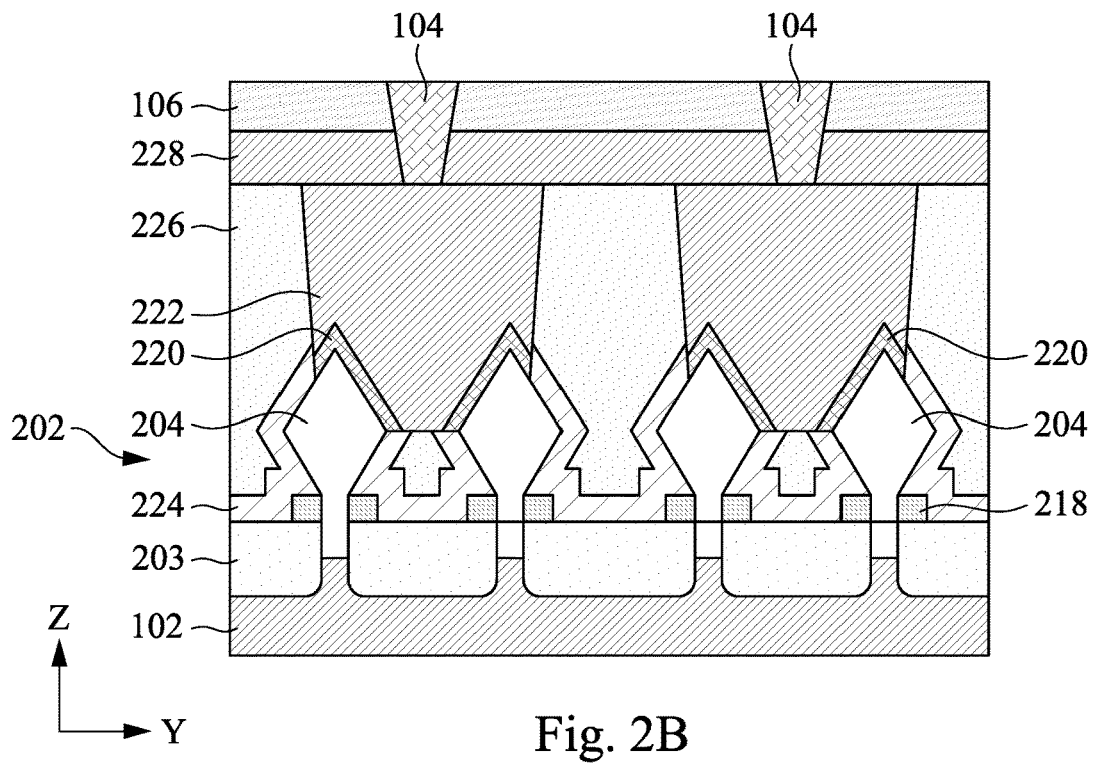

FIGS. 2A-16A are cross-sectional side views of various stages of manufacturing the semiconductor device structure 100 taken along line A-A of FIG. 1, in accordance with some embodiments. FIGS. 2B-16B are cross-sectional side views of various stages of manufacturing the semiconductor device structure 100 taken along line B-B of FIG. 1, in accordance with some embodiments. FIG. 2A is a cross-sectional side view of the semiconductor device structure 100 taken along line A-A of FIG. 1, and FIG. 2B is a cross-sectional side view of the semiconductor device structure 100 taken along line B-B of FIG. 1. The line A-A of FIG. 1 extends along a direction that is substantially perpendicular to the longitudinal direction of a gate stack 206, and the line B-B of FIG. 1 extends along the longitudinal direction of the gate stack 206. As shown in FIGS. 2A and 2B, the semiconductor device structure 100 includes the substrate 102, one or more devices 202 formed on the substrate 102, the dielectric material 106 formed over the devices 202, and the conductive features 104 formed in the dielectric material 106. The substrate 102 may be a semiconductor substrate. In some embodiments, the substrate 102 includes a single crystalline semiconductor layer on at least the surface of the substrate 102. The substrate 102 may include a single crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb), and indium phosphide (InP). For example, the substrate 102 is made of Si. In some embodiments, the substrate 102 is a silicon-on-insulator (SOI) substrate, which includes an insulating layer (not shown) disposed between two silicon layers. In one aspect, the insulating layer is an oxygen-containing material, such as an oxide.

The substrate 102 may include one or more buffer layers (not shown) on the surface of the substrate 102. The buffer layers can serve to gradually change the lattice constant from that of the substrate to that of the source/drain regions. The buffer layers may be formed from epitaxially grown single crystalline semiconductor materials such as, but not limited to Si, Ge, germanium tin (GeSn), SiGe, GaAs, InSb, GaP, GaSb, InAlAs, InGaAs, GaSbP, GaAsSb, GaN, GaP, and InP. In one embodiment, the substrate 102 includes SiGe buffer layers epitaxially grown on the silicon substrate 102. The germanium concentration of the SiGe buffer layers may increase from 30 atomic percent germanium for the bottom-most buffer layer to 70 atomic percent germanium for the top-most buffer layer.

The substrate 102 may include various regions that have been suitably doped with impurities (e.g., p-type or n-type impurities). The dopants are, for example boron for an n-type fin field effect transistor (FinFET) and phosphorus for a p-type FinFET.

As described above, the devices 202 may be any suitable devices, such as transistors, diodes, imaging sensors, resistors, capacitors, inductors, memory cells, or a combination thereof. In some embodiments, the devices 202 are transistors, such as planar field effect transistors (FETs), FinFETs, nanosheet transistors, or other suitable transistors. The nanosheet transistors may include nanowire transistors, gate-all-around (GAA) transistors, multi-bridge channel (MBC) transistors, or any transistors having the gate electrode surrounding the channels. An example of the device 202 formed between the substrate 102 and the conductive features 104 is a FinFET, which is shown in FIGS. 2A and 2B. The device 202 includes source/drain (S/D) regions 204 and gate stacks 206. Each gate stack 206 may be disposed between S/D regions 204 serving as source regions and S/D regions 204 serving as drain regions. For example, each gate stack 206 may extend along the Y-axis between a plurality of S/D regions 204 serving as source regions and a plurality of S/D regions 204 serving as drain regions. As shown in FIG. 2A, two gate stacks 206 are formed on the substrate 102. In some embodiments, more than two gate stacks 206 are formed on the substrate 102. Channel regions 208 are formed between S/D regions 204 serving as source regions and S/D regions 204 serving as drain regions.

The S/D regions 204 may include a semiconductor material, such as Si or Ge, a III-V compound semiconductor, a II-VI compound semiconductor, or other suitable semiconductor material. Exemplary S/D region 204 may include, but are not limited to, Ge, SiGe, GaAs, AlGaAs, GaAsP, SiP, InAs, AlAs, InP, GaN, InGaAs, InAlAs, GaSb, AlP, GaP, and the like. The S/D regions 204 may include p-type dopants, such as boron; n-type dopants, such as phosphorus or arsenic; and/or other suitable dopants including combinations thereof. The S/D regions 204 may be formed by an epitaxial growth method using CVD, atomic layer deposition (ALD) or molecular beam epitaxy (MBE). The channel regions 208 may include one or more semiconductor materials, such as Si, Ge, GeSn, SiGe, GaAs, InSb, GaP, GaSb, InAlAs, InGaAs, GaSbP, GaAsSb, GaN, GaP, or InP. In some embodiments, the channel regions 208 include the same semiconductor material as the substrate 102. In some embodiments, the devices 202 are FinFETs, and the channel regions 208 are a plurality of fins disposed below the gate stacks 206. In some embodiments, the devices 202 are nanosheet transistors, and the channel regions 208 are surrounded by the gate stacks 206.

Each gate stack 206 includes a gate electrode layer 210 disposed over the channel region 208 (or surrounding the channel region 208 for nanosheet transistors). The gate electrode layer 210 may be a metal-containing material such as tungsten, cobalt, aluminum, ruthenium, copper, multilayers thereof, or the like, and can be deposited by ALD, plasma enhanced chemical vapor deposition (PECVD), MBD, physical vapor deposition (PVD), or any suitable deposition technique. Each gate stack 206 may include an interfacial dielectric layer 212, a gate dielectric layer 214 disposed on the interfacial dielectric layer 212, and one or more conformal layers 216 disposed on the gate dielectric layer 214. The gate electrode layer 210 may be disposed on the one or more conformal layers 216. The interfacial dielectric layer 212 may include a dielectric material, such as an oxygen-containing material or a nitrogen-containing material, or multilayers thereof, and may be formed by any suitable deposition method, such as CVD, PECVD, or ALD. The gate dielectric layer 214 may include a dielectric material such as an oxygen-containing material or a nitrogen-containing material, a high-k dielectric material having a k value greater than about 7.0, or multilayers thereof. The gate dielectric layer 214 may be formed by any suitable method, such as CVD, PECVD, or ALD. The one or more conformal layers 216 may include one or more barrier layers and/or capping layers, such as a nitrogen-containing material, for example tantalum nitride (TaN), titanium nitride (TiN), or the like. The one or more conformal layers 216 may further include one or more work-function layers, such as aluminum titanium carbide, aluminum titanium oxide, aluminum titanium nitride, or the like. The term "conformal" may be used herein for ease of description upon a layer having substantial same thickness over various regions. The one or more conformal layers 216 may be deposited by ALD, PECVD, MBD, or any suitable deposition technique.

Gate spacers 218 are formed along sidewalls of the gate stacks 206 (e.g., sidewalls of the gate dielectric layers 214). The gate spacers 218 may include silicon oxycarbide, silicon nitride, silicon oxynitride, silicon carbon nitride, the like, multi-layers thereof, or a combination thereof, and may be deposited by CVD, ALD, or other suitable deposition technique.

Portions of the gate stacks 206 and the gate spacers 218 may be formed on isolation regions 203. The isolation regions 203 are formed on the substrate 102. The isolation regions 203 may include an insulating material such as an oxygen-containing material, a nitrogen-containing material, or a combination thereof. The insulating material may be formed by a high-density plasma chemical vapor deposition (HDP-CVD), a flowable chemical vapor deposition (FCVD), or other suitable deposition process. In one aspect, the isolation regions 203 includes silicon oxide that is formed by a FCVD process.

A contact etch stop layer (CESL) 224 is formed on a portion of the S/D regions 204 and the isolation region 203, and a first interlayer dielectric (ILD) 226 is formed on the CESL 224. The CESL 224 can provide a mechanism to stop an etch process when forming openings in the first ILD 226. The CESL 224 may be conformally deposited on surfaces of the S/D regions 204 and the isolation regions 203. The CESL 224 may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be deposited by CVD, PECVD, ALD, or any suitable deposition technique. The first ILD 226 may include tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), organosilicate glass (OSG), SiOC, and/or any suitable low-k dielectric materials (e.g., a material having a dielectric constant lower than silicon dioxide), and may be deposited by spin-on, CVD, FCVD, PECVD, PVD, or any suitable deposition technique.

A silicide layer 220 is formed on at least a portion of each S/D region 204, as shown in FIGS. 2A and 2B. The silicide layer 220 may include a material having one or more of WSi, CoSi, NiSi, TiSi, MoSi and TaSi. In some embodiments, the silicide layer 220 includes a metal or metal alloy silicide, and the metal includes a noble metal, a refractory metal, a rare earth metal, alloys thereof, or combinations thereof. A conductive contact 222 is disposed on each silicide layer 220. The conductive contact 222 may include a material having one or more of Ru, Mo, Co, Ni. W, Ti, Ta, Cu, Al, TiN or TaN, and the conductive contact 222 may be formed by any suitable method, such as electro-chemical plating (ECP), or PVD. The silicide layer 220 and the conductive contact 222 may be formed by first forming an opening in the first ILD 226 and the CESL 224 to expose at least a portion of the S/D region 204, then forming the silicide layer 220 on the exposed portion of the S/D region 204, and then forming the conductive contact 222 on the silicide layer 220.

An etch stop layer 228 may be formed over the devices 202, as shown in FIGS. 2A and 2B. The etch stop layer 228 may include the same material as the CESL 224 and may be deposited by the same process as that for the CESL 224. The dielectric material 106 is formed on the etch stop layer 228. The dielectric material 106 may be another etch stop layer. The dielectric material 106 may include the same material as the etch stop layer 228 and may be deposited by the same process as that for the etch stop layer 228. The conductive features 104 are formed in the etch stop layer 228 and the dielectric material 106, and each conductive feature 104 may be in contact with a corresponding conductive contact 222.

Figure 3A:
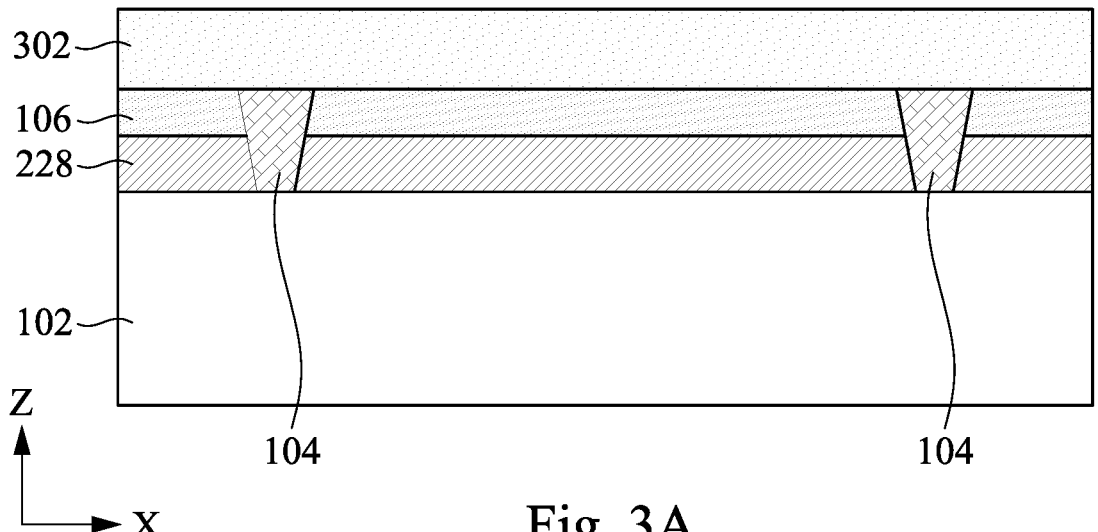
Figure 3B:
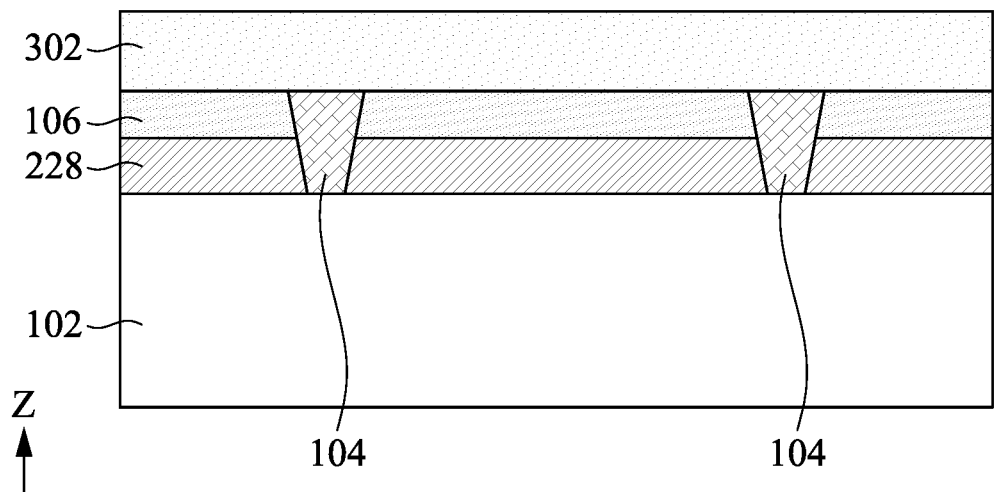

Next, as shown in FIGS. 3A and 3B, a dielectric material 302 is formed on the dielectric material 106 and the plurality of conductive features 104. The devices 202 (FIGS. 2A and 2B) and other features formed on the substrate 102 are omitted for clarity. The dielectric material 302 may be a second ILD layer. The dielectric material 302 may include SiC, LaO, AlO, AlON, ZrO, HfO, SiN, ZnO, ZrN, ZrAlO, TiO, TaO, YO, TaCN, ZrSi, SiOCN, SiOC, SiCN, HfSi, or SiO. In some embodiments, the dielectric material 302 may have a thickness ranging from about 1 nanometer (nm) to about 40 nm. If the thickness of the dielectric material 302 is greater than about 20 nm, the manufacturing cost is increased without significant advantage; if the thickness of the dielectric material 302 is less than about 1 nm, the dielectric material 302 may be insufficient to isolate any conductive features formed therebelow from the conductive features formed thereon. The dielectric material 302 may be formed by any suitable method, such as CVD or PECVD.

Figure 4A:
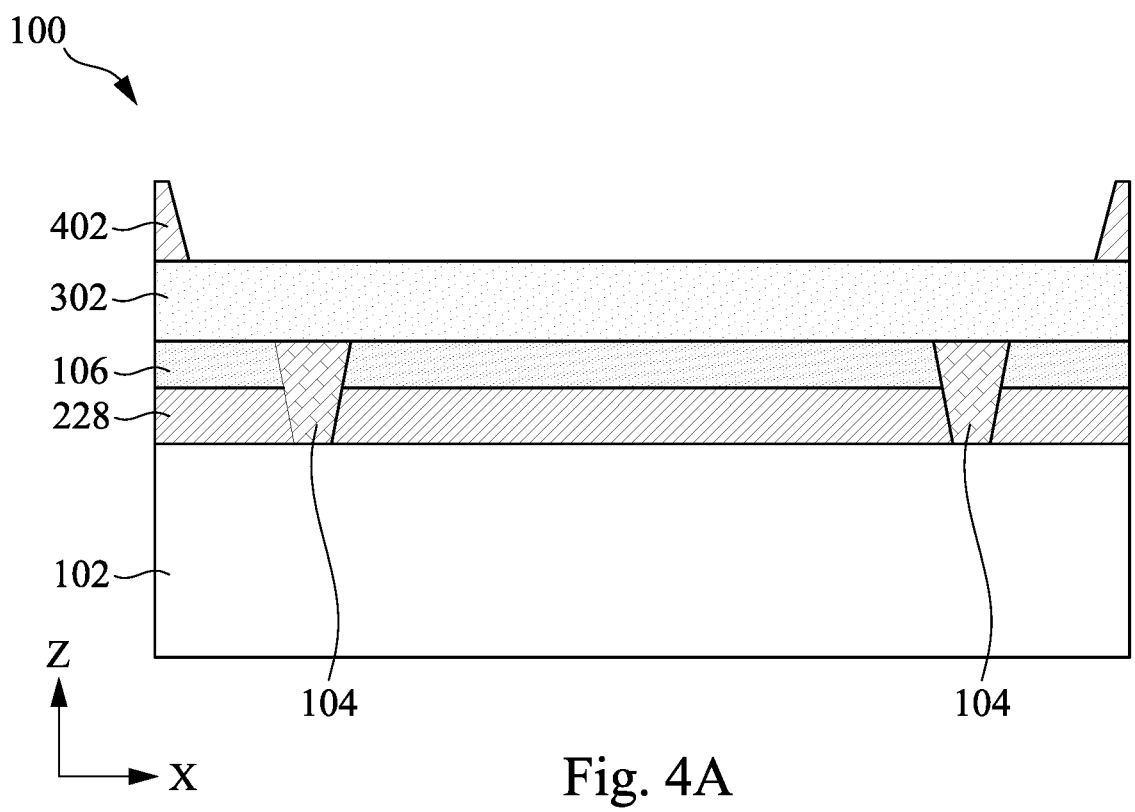
Figure 4B:
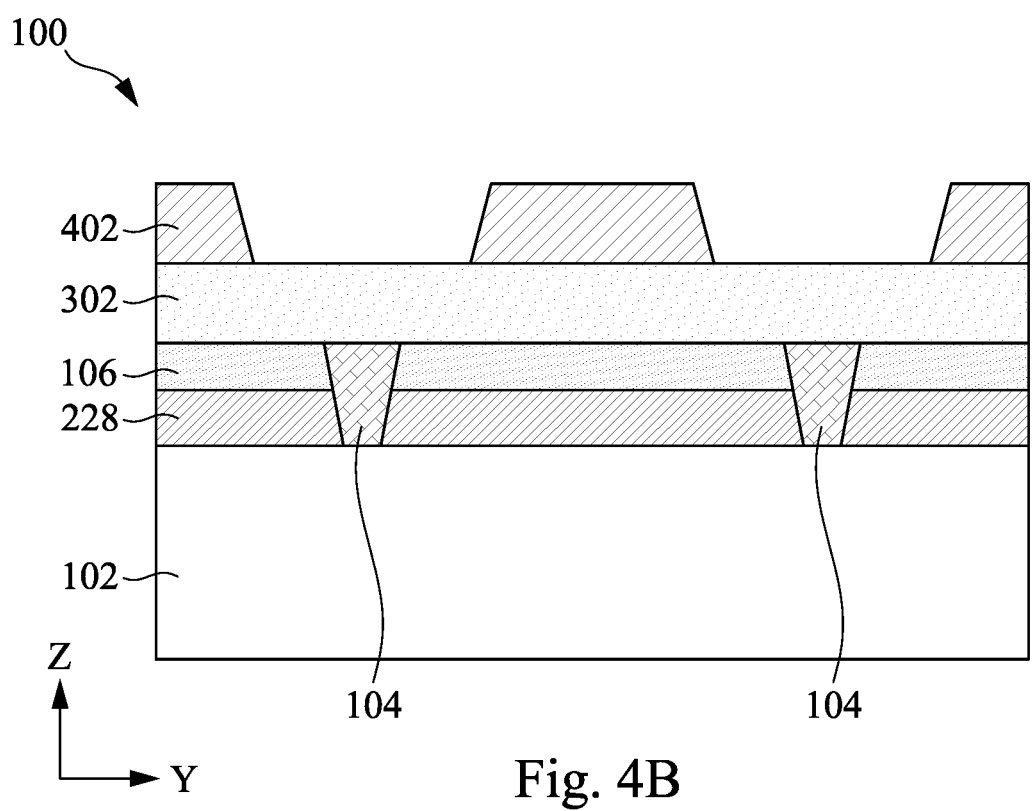

Next, as shown in FIGS. 4A and 4B, a mask layer 402 is formed on portions of the dielectric material 302. The mask layer 402 may be formed by first forming a layer on the dielectric material 302. The layer may include an oxygen-containing material or a nitrogen-containing material, such as a silicon oxide layer, a silicon nitride layer, a silicon oxynitride layer, or combinations thereof. The layer may be patterned and etched to form the mask layer 402. The patterning process may include a photolithography process that may include forming a photoresist layer (not shown) over the layer, exposing the resist to a pattern, performing post-exposure bake processes, and developing the resist. In some embodiments, patterning the resist may be performed using an acceptable lithography process, such as an electron beam (e-beam) lithography process, an extreme ultraviolet lithography process, or the like. The pattern of the resist is transferred to the layer using one or more etching processes to form the mask layer 402. In some embodiments, the etching process may include dry etching (e.g., reactive ion etching (RIE)), wet etching, other etching methods, and/or combinations thereof.

Figure 5A:
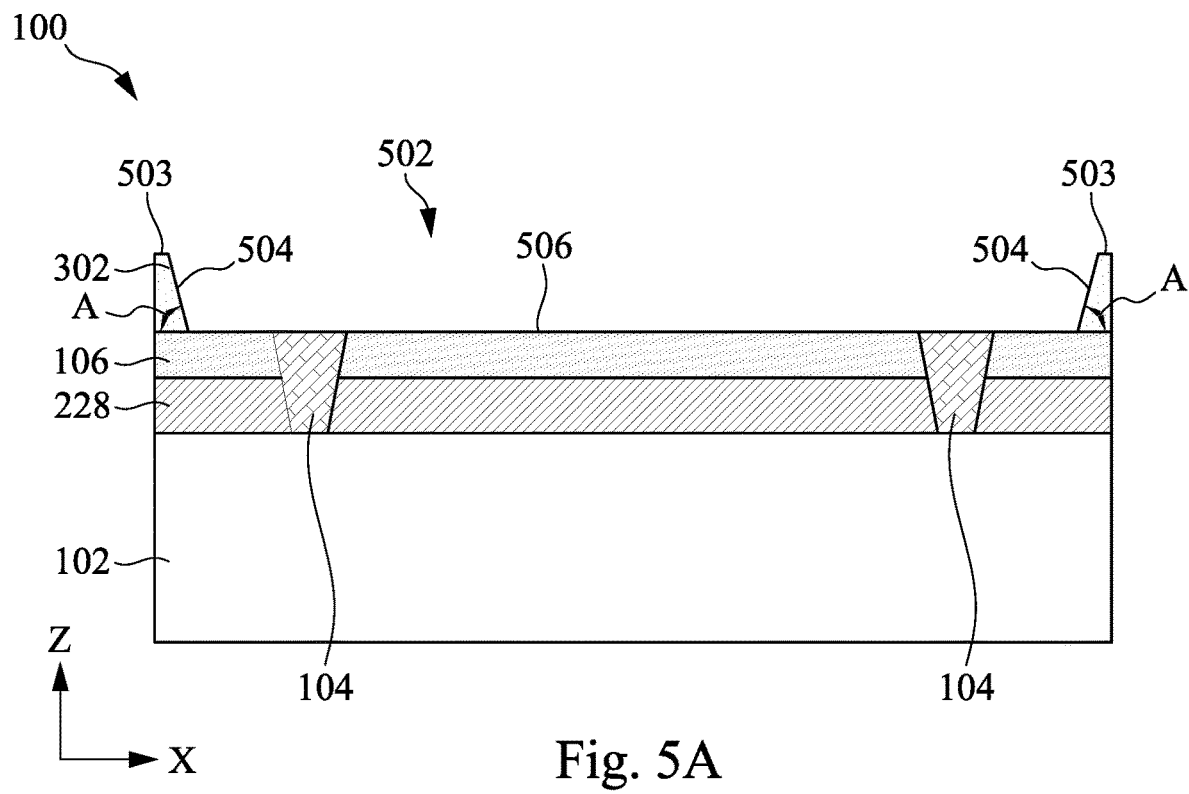
Figure 5B:
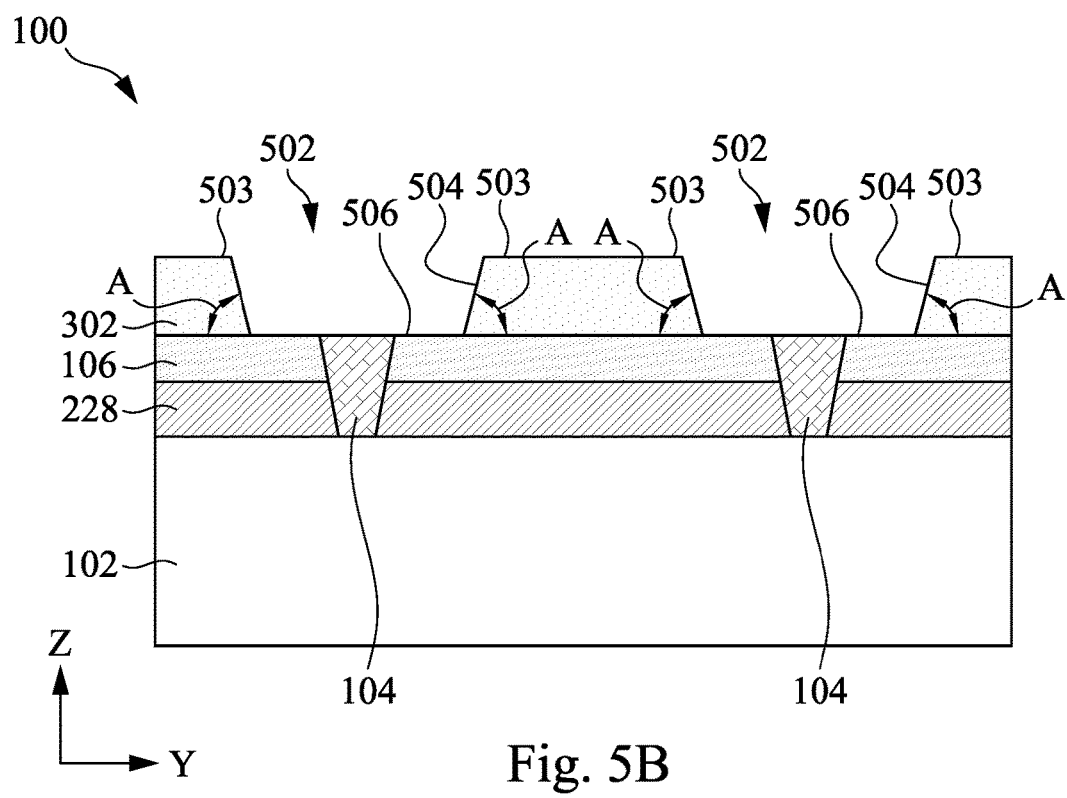

The pattern of the mask layer 402 is transferred to the dielectric material 302 by removing portions of the dielectric material 302 not covered by the mask layer 402, as shown in FIGS. 5A and 5B. The removal of portions of the dielectric material 302 may be performed by any suitable method, such as dry etching, wet etching, or a combination thereof. The mask layer 402 is then removed. The remaining dielectric material 302 has a top surface 503 and sidewalls 504. Openings 502 are formed as the result of the removal of the portions of the dielectric material 302. Each opening 502 may be defined by the corresponding sidewall 504. In some embodiments, openings 502 are trenches, and the sidewall 504 defining each trench includes multiple surfaces, such as 4 surfaces, as shown in FIGS. 5A and 5B. In some embodiments, openings 502 are vias, and the sidewall 504 defining each via is a continuous surface. The sidewall 504 may form an acute angle A with respect to a top surface 506 of the dielectric material 106 as a result of the etching process. The acute angle A may range from about 60 degrees to about 89.5 degrees. In the embodiment where the sidewall 504 includes multiple surfaces, each surface may form the acute angle A with respect to the top surface 506 of the dielectric material 106, the acute angles A of the surfaces of the sidewall 504 may be substantially the same or different.

As shown in FIGS. 5A and 5B, the openings 502 expose the conductive features 104 and portions of the top surface 506 of the dielectric material 106. In some embodiments, when the conductive features 104 are not present in the etch stop layer 228 and the dielectric material 106, portions of the dielectric material 106 and the etch stop layer 228 not covered by the dielectric material 302 are removed to expose the conductive contacts 222 and portions of the first ILD 226 (FIGS. 2A and 2B). The removal of the portions of the first dielectric material 106 and the etch stop layer 228 may be performed by the same process as the removal of the portion of the dielectric material 302 or by a separate process as the removal of the portion of the dielectric material 302. As shown in FIG. 5A, 2 conductive features 104 are exposed along the X-axis. In some embodiments, more than 2 conductive features 104, such as more than 5 or more than 10 conductive features 104 are exposed. In the embodiment where the conductive features 104 are not present, more than 2 conductive contacts 222 (FIGS. 2A and 2B), such as more than 5 or more than 10 conductive contacts 222, are exposed.

Figure 6A:
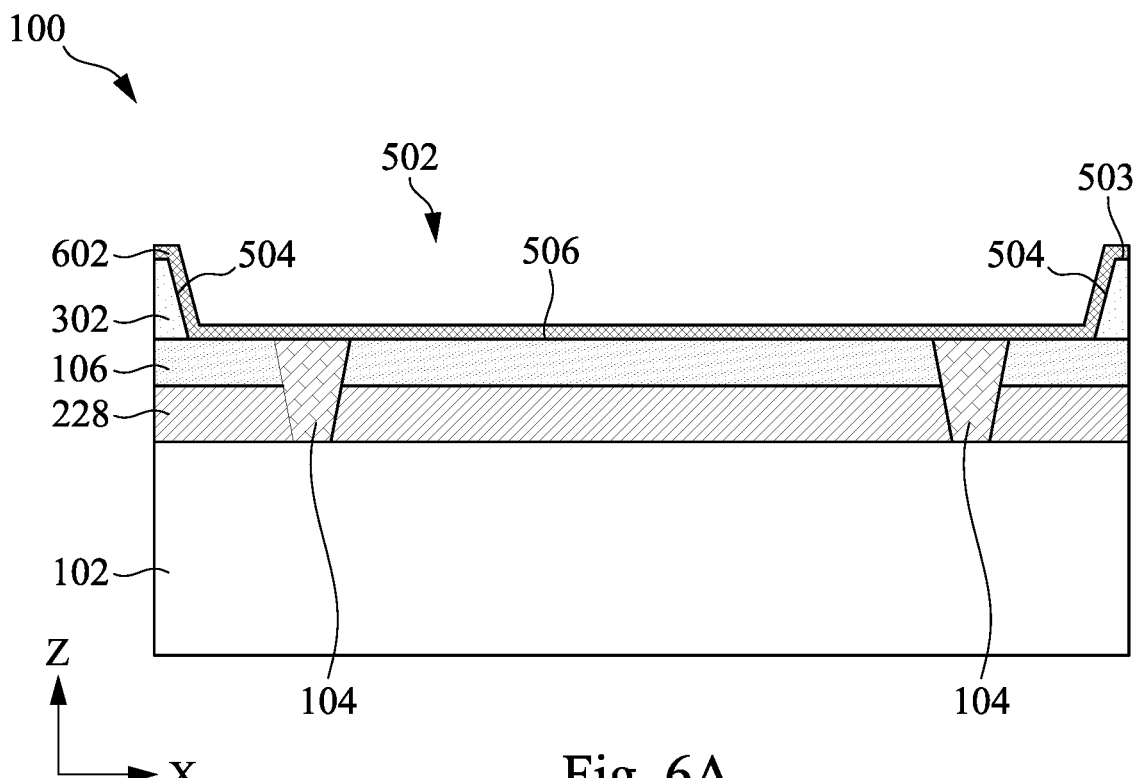
Figure 6B:
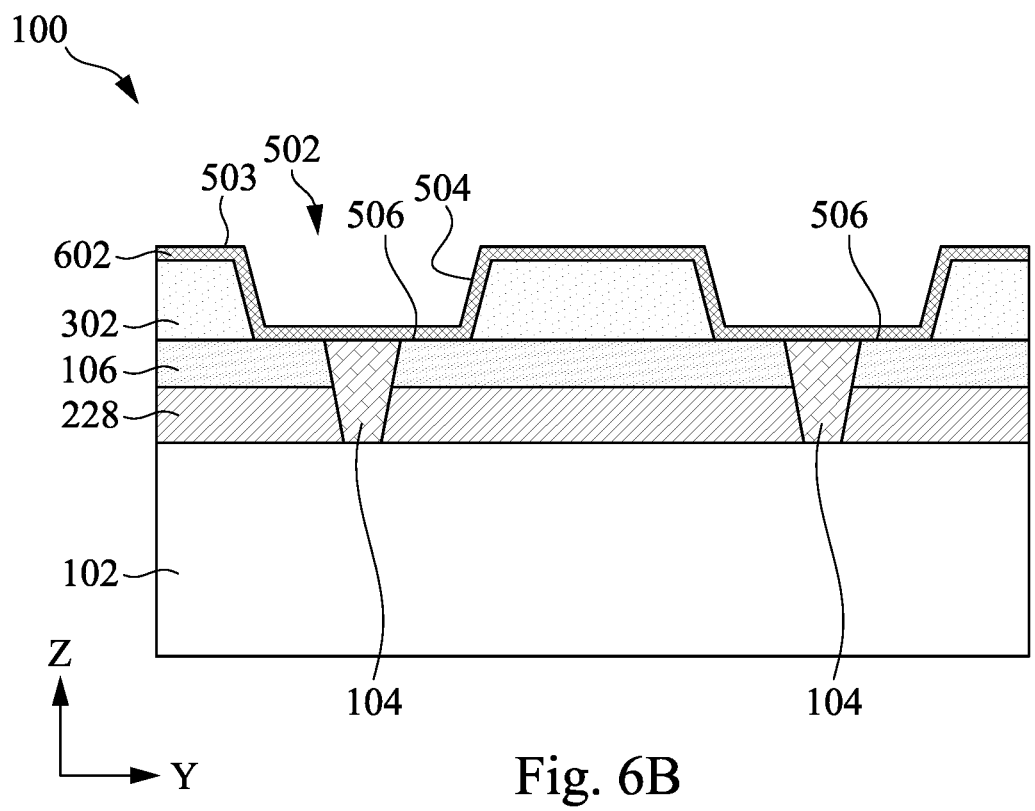
Figure 7A:
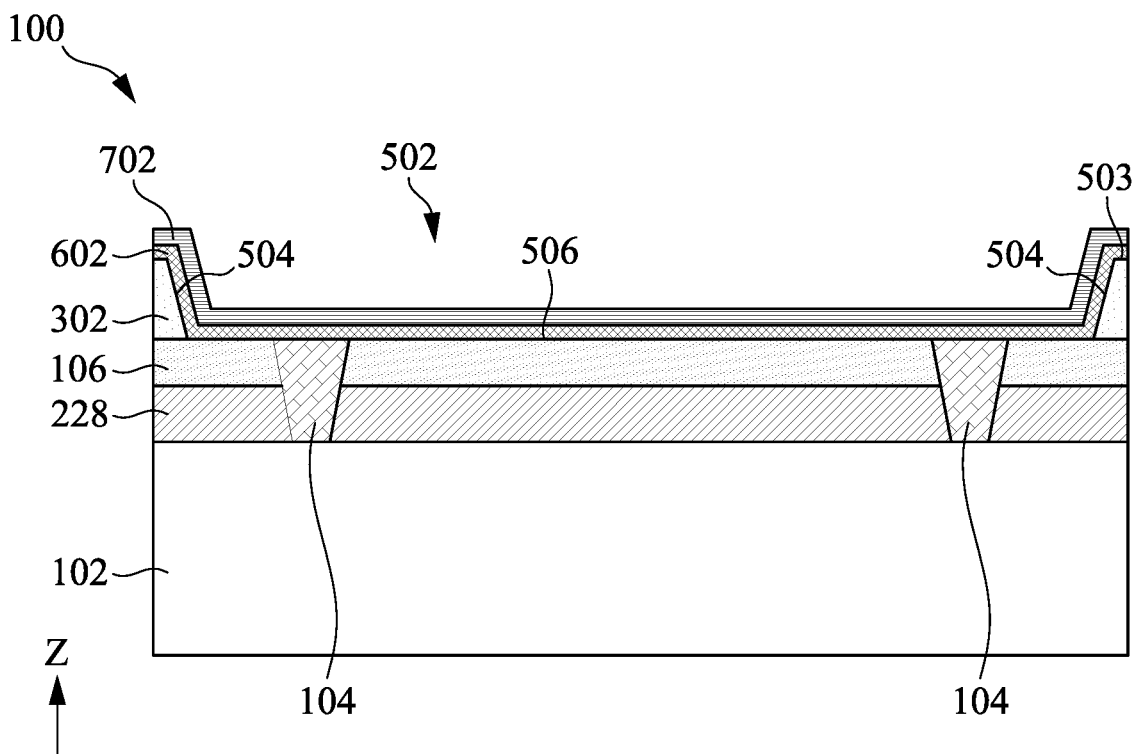
Figure 7B:
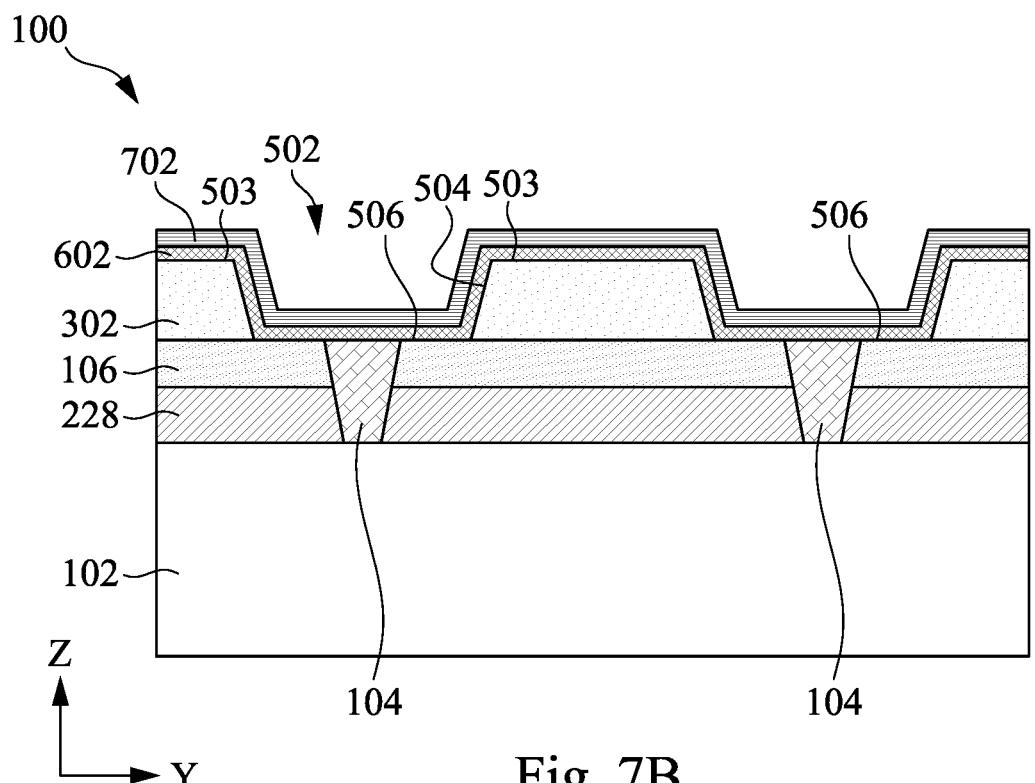
Figure 15A:
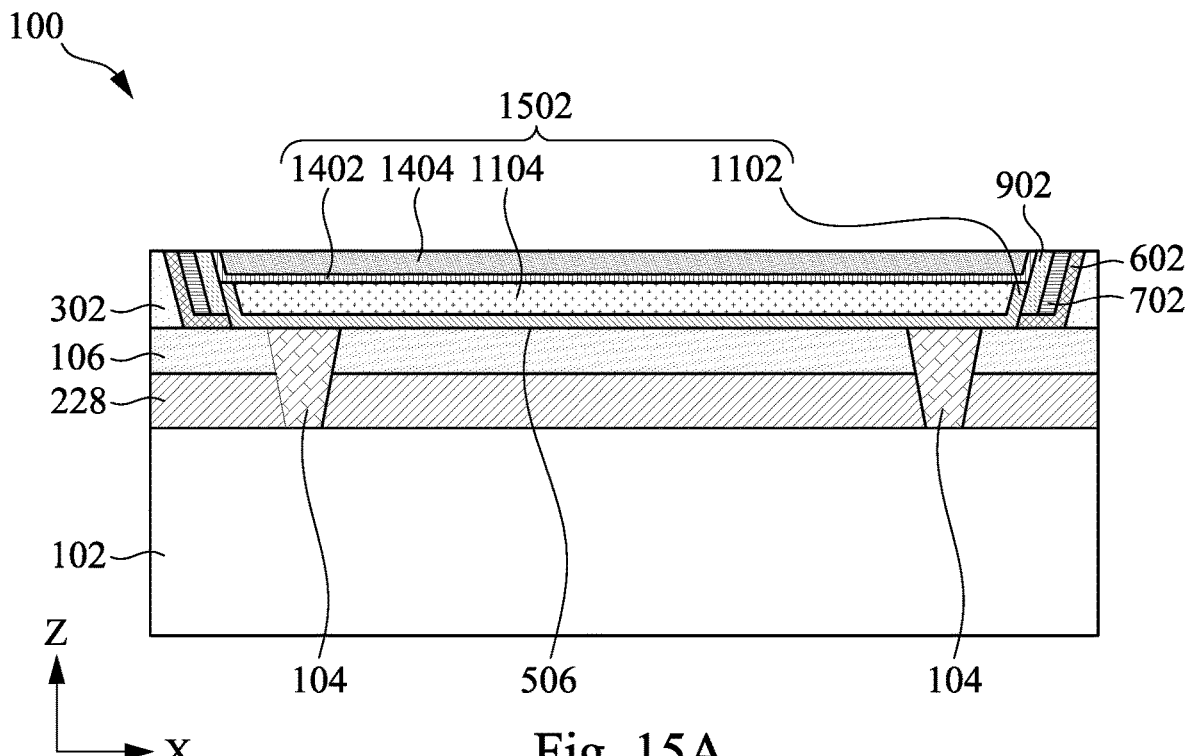
Figure 15B:
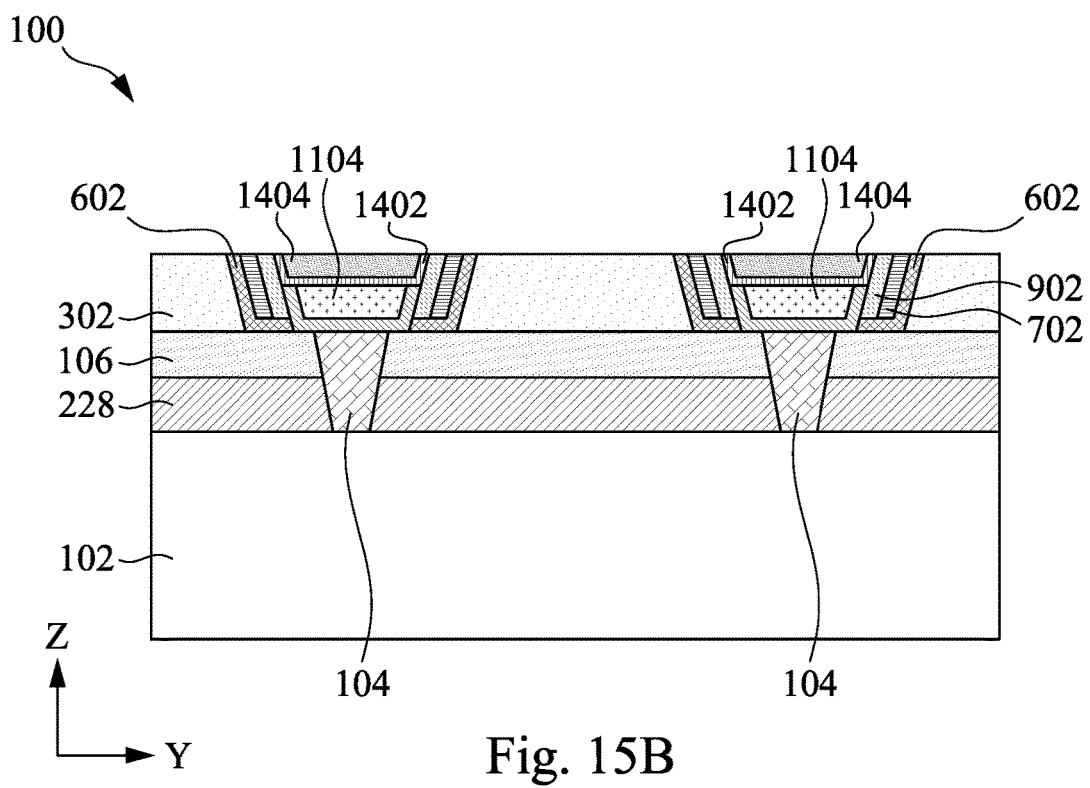

A first spacer layer 602 is formed on the top surfaces 503 of the dielectric material 302, the sidewalls 504 of the dielectric material 302, the exposed portions of the top surface 506 of the dielectric material 106, and the conductive features 104, as shown in FIGS. 6A and 6B. The first spacer layer 602 may include SiC, LaO, AlO, AlON, ZrO, HfO, SiN, ZnO, ZrN, ZrAlO, TiO, TaO, YO, TaCN, ZrSi, SiOCN, SiOC, SiCN, HfSi, or SiO. The first spacer layer 602 may include the same or different material as the dielectric material 302. In some embodiments, the first spacer layer 602 may be conformally deposited and may have a thickness ranging from about 0.5 nm to about 10 nm. The first spacer layer 602 protects the conductive features 104 (or conductive contacts 222 shown in FIGS. 2A and 2B if the conductive features 104 are not present) during subsequent removal of portions of a sacrificial spacer layer 702 (FIGS. 7A and 7B). Thus, if the thickness of the first spacer layer 602 is less than about 0.5 nm, the first spacer layer 602 may not be sufficient to protect the conductive features 104. On the other hand, if the thickness of the first spacer layer 602 is greater than about 10 nm, the dimensions of an air gap 1602 (FIGS. 16A and 16B) formed subsequently on the first spacer layer 602 may be too small to provide improved isolation between neighboring conductive structures 1502 (FIGS. 15A and 15B). The first spacer layer 602 may be formed by any suitable method, such as ALD, CVD or PECVD.

Figure 16A:
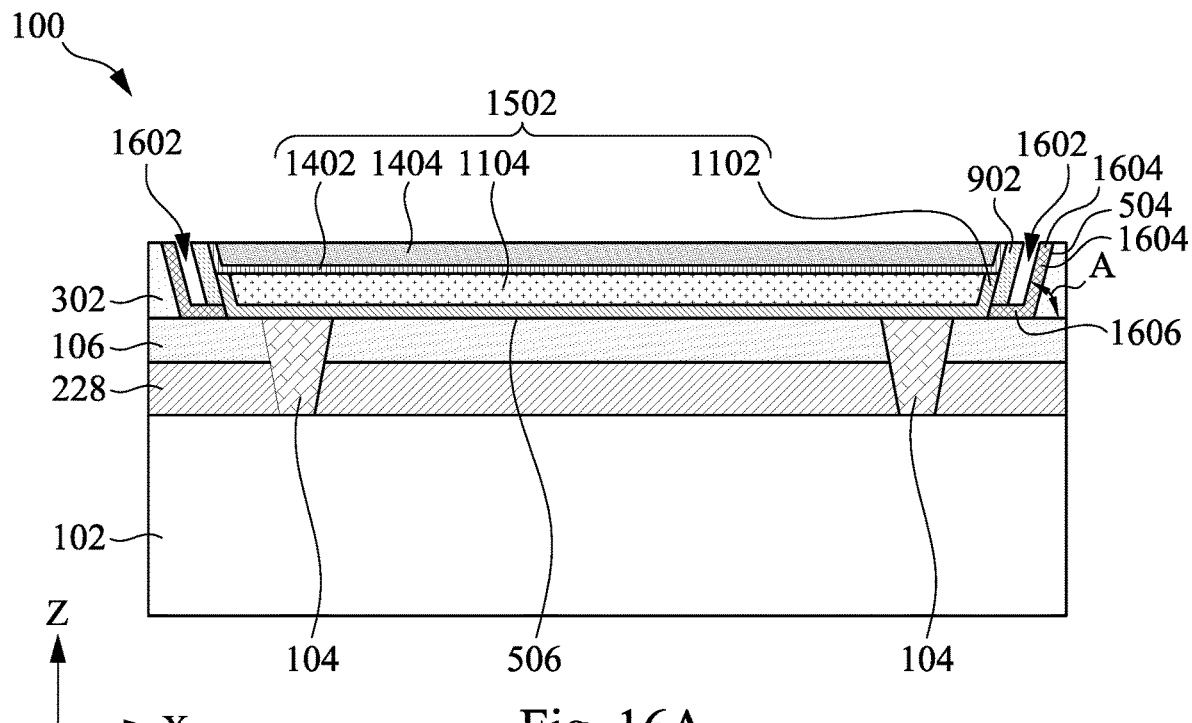
Figure 16B:
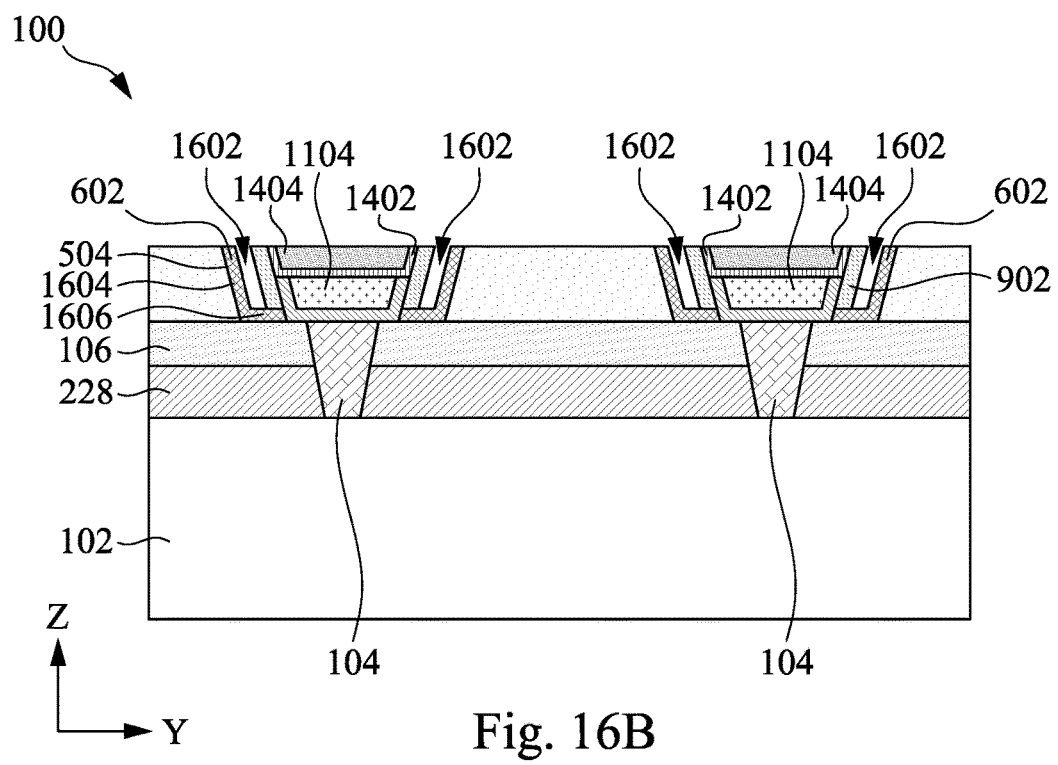

The sacrificial spacer layer 702 is formed on the first spacer layer 602, as shown in FIGS. 7A and 7B. The sacrificial spacer layer 702 may be formed over the top surfaces 503 of the dielectric material 302, the portions of the top surface 506 of the dielectric material 106, the conductive features 104, and adjacent the sidewalls 504 of the dielectric material 302. The sacrificial spacer layer 702 may include a material having different etch selectivity than the material of the first spacer layer 602. For example, the sacrificial spacer layer 702 may include a semiconductor material, such as Si, Ge, SiGeB, or other suitable semiconductor material, which has a different etch selectivity than the dielectric material of the first spacer layer 602. In some embodiments, the sacrificial spacer layer 702 may be conformally deposited and may have a thickness ranging from about 0.5 nm to about 6 nm. The thickness of the sacrificial spacer layer 702 defines a width of the air gap 1602 (FIGS. 16A and 16B). Thus, if the width of the air gap 1602 is less than about 0.5 nm, the air gap 1602 may not provide improved electrical isolation between neighboring conductive structures 1502 (FIGS. 15A and 15B). On the other hand, if the width of the air gap 1602 is greater than about 6 nm, any materials, such as a sealing material 1802 (FIGS. 18A and 18B), formed over the air gap 1602 may fill the entire air gap 1602. The sacrificial spacer layer 702 may be formed by any suitable method, such as ALD, CVD or PECVD.

Figure 8A:
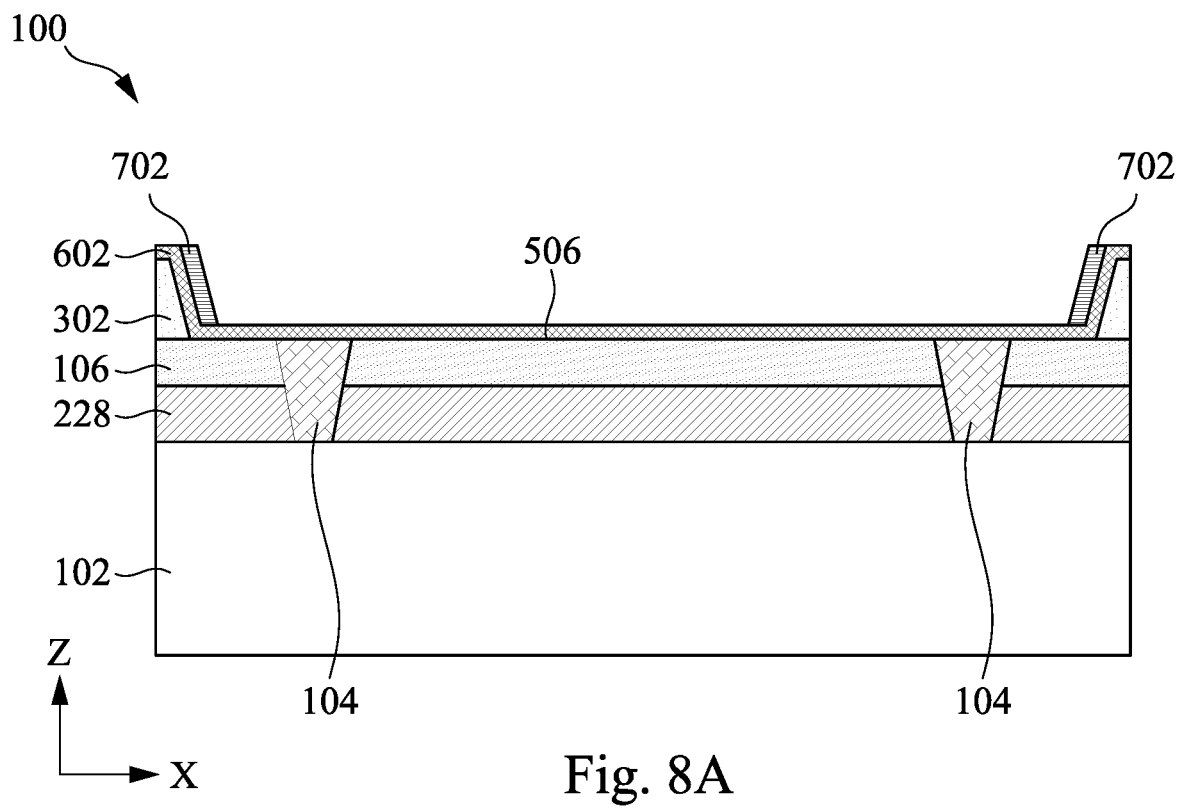
Figure 8B:
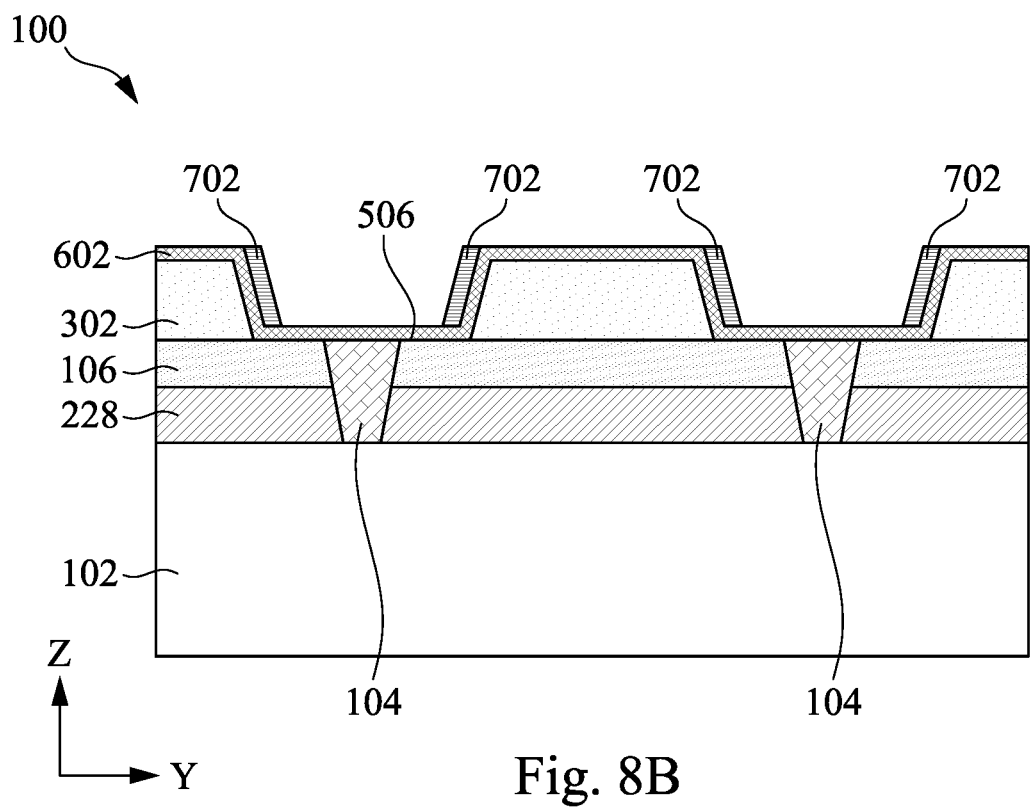

Next, as shown in FIGS. 8A and 8B, portions of the sacrificial spacer layer 702 are removed. In some embodiments, the portions of the sacrificial spacer layer 702 disposed over the top surfaces 503 of the dielectric material 302, the portions of the top surface 506 of the dielectric material 106, and the conductive features 104 are removed, leaving the portion of the sacrificial spacer layer 702 adjacent the sidewall 504 of the dielectric material 302. In other words, the remaining portion of the sacrificial spacer layer 702 is disposed adjacent and in contact with the portion of the first spacer layer 602 that is disposed adjacent and in contact with the sidewall 504 of the dielectric material 302. Portions of the first spacer layer 602 that are disposed on the top surface 503 of the dielectric material 302, the portions of the top surface 506 of the dielectric material 106, and the conductive features 104 are exposed.

The removal of the portions of the sacrificial spacer layer 702 may be performed by any suitable method, such as an etching process. In one example, the etching process is an anisotropic dry etch process that utilizes chlorine or fluorine based etchant. The anisotropic dry etch removes the portions of the sacrificial spacer layer 702 disposed on horizontal surfaces but does not remove the portions disposed adjacent the sidewalls 504 of the dielectric material 302. The chlorine or fluorine based etchant selectively removes the portions of the sacrificial spacer layer 702, while the first spacer layer 602 is not removed. The first spacer layer 602 protects the conductive features 104 (or conductive contacts 222 shown in FIGS. 2A and 2B if the conductive features 104 are not present) during the removal of the portions of the sacrificial spacer layer 702.

Figure 9A:
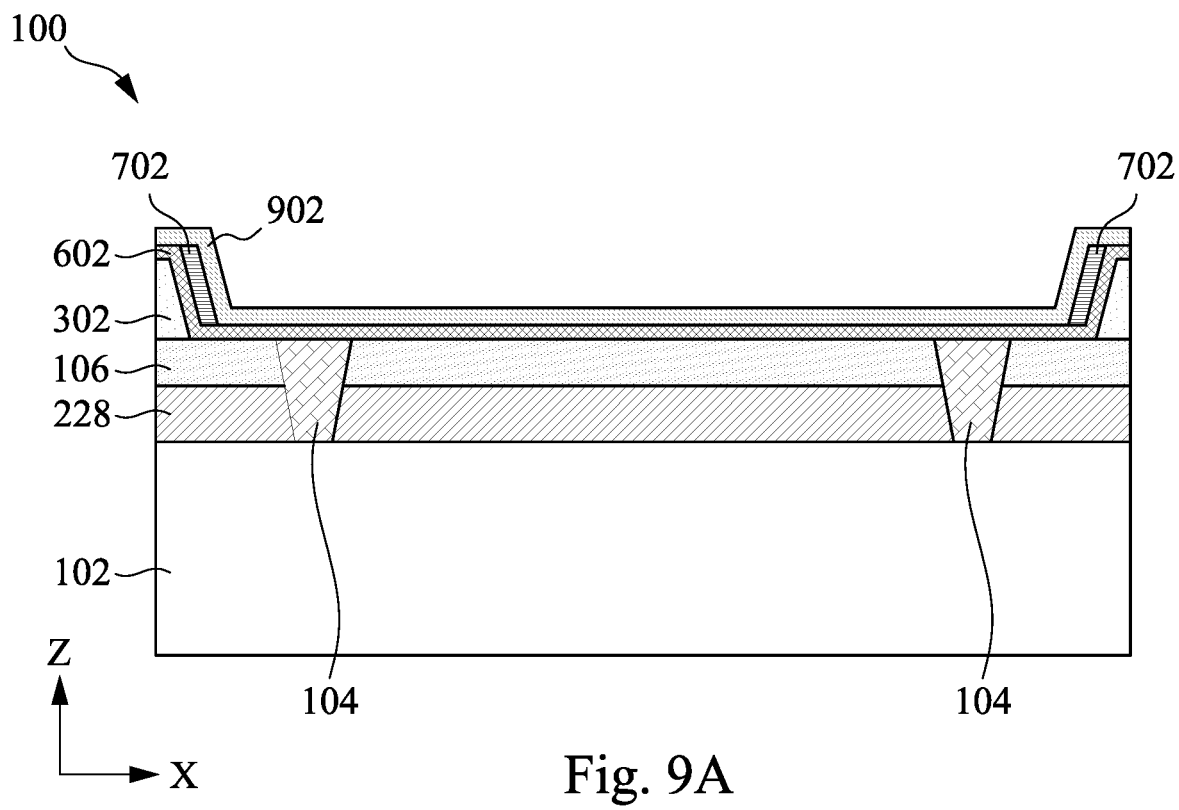
Figure 9B:
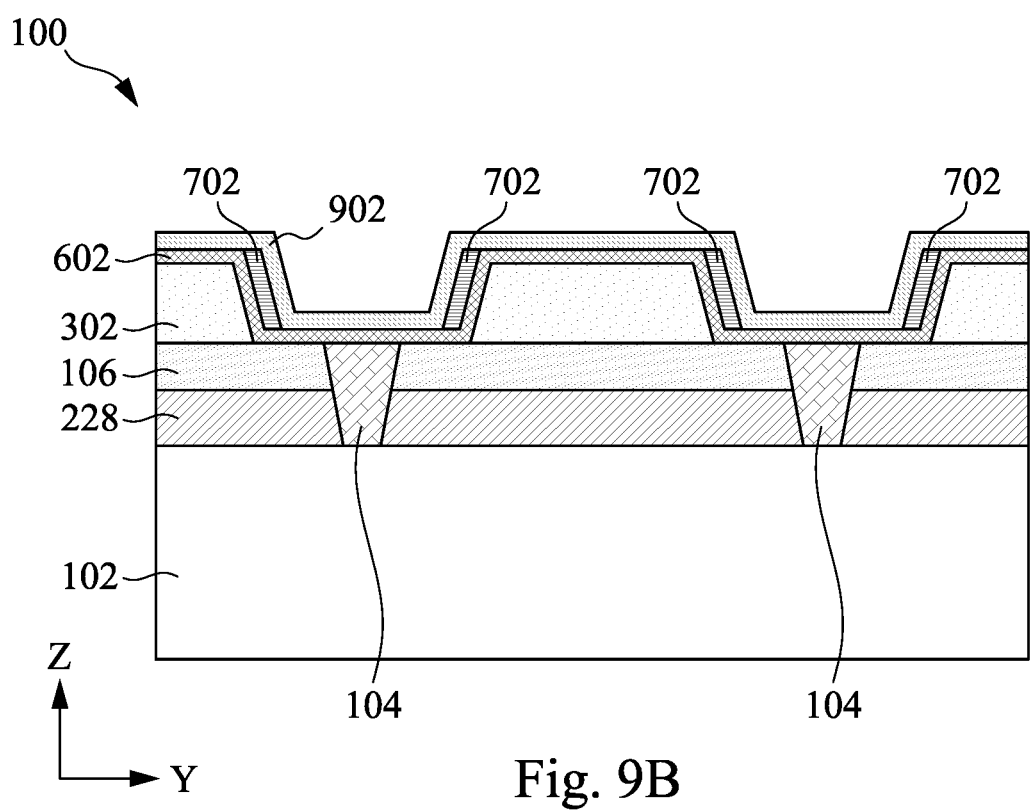

A second spacer layer 902 is formed on the exposed portions of the first spacer layer 602 and the sacrificial spacer layer 702, as shown in FIGS. 9A and 9B. The second spacer layer 902 may include SiC, LaO, AlO, AlON, ZrO, HfO, SiN, ZnO, ZrN, ZrAlO, TiO, TaO, YO, TaCN, ZrSi, SiOCN, SiOC, SiCN, HfSi, or SiO. The second spacer layer 902 may include the same or different material as the first spacer layer 602. The second spacer layer 902 may be formed from a material having a different etch selectivity as the sacrificial spacer layer 702. In some embodiments, the second spacer layer 902 may be conformally deposited and may have a thickness ranging from about 0.5 nm to about 6 nm. The second spacer layer 902 provides structural support to the conductive structure 1502 (FIGS. 15A and 15B). Thus, if the thickness of the second spacer layer 902 is less than about 0.5 nm, the second spacer layer 902 may not be sufficient to support the conductive structure 1502 (FIGS. 15A and 15B). On the other hand, if the thickness of the second spacer layer 902 is greater than about 6 nm, the manufacturing cost is increased without significant advantage. The second spacer layer 902 may be formed by any suitable method, such as ALD, CVD or PECVD.

Figure 10A:
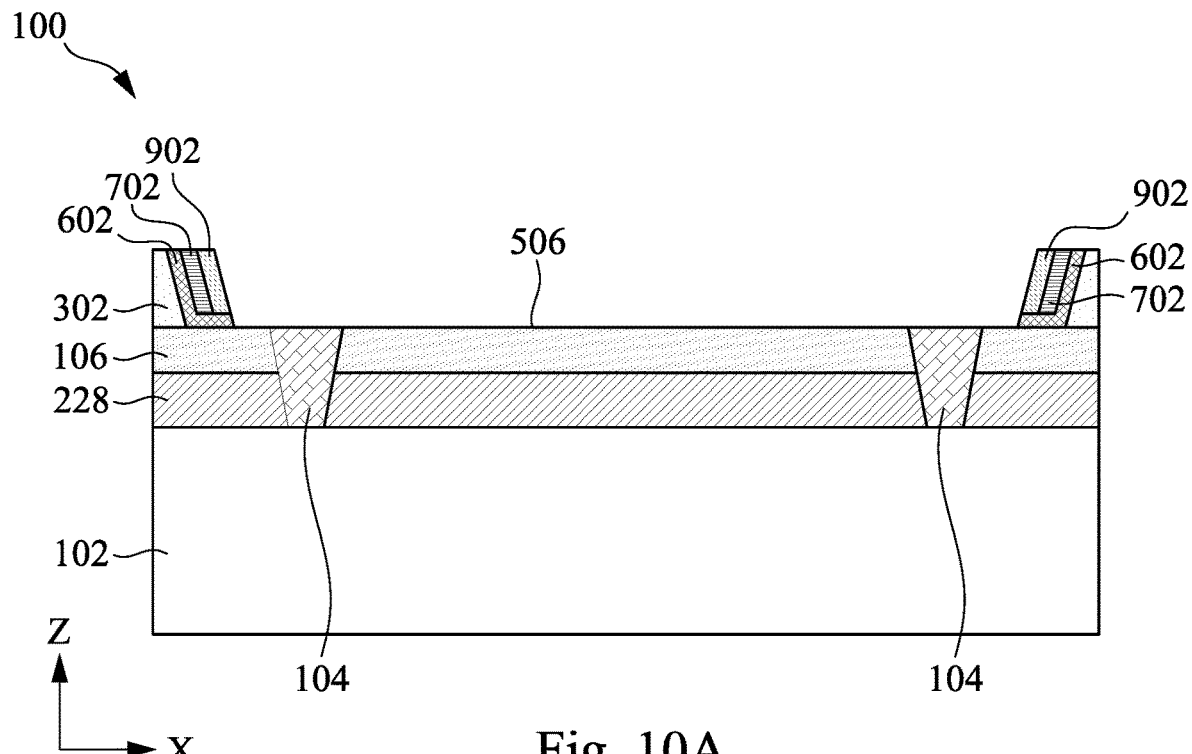
Figure 10B:
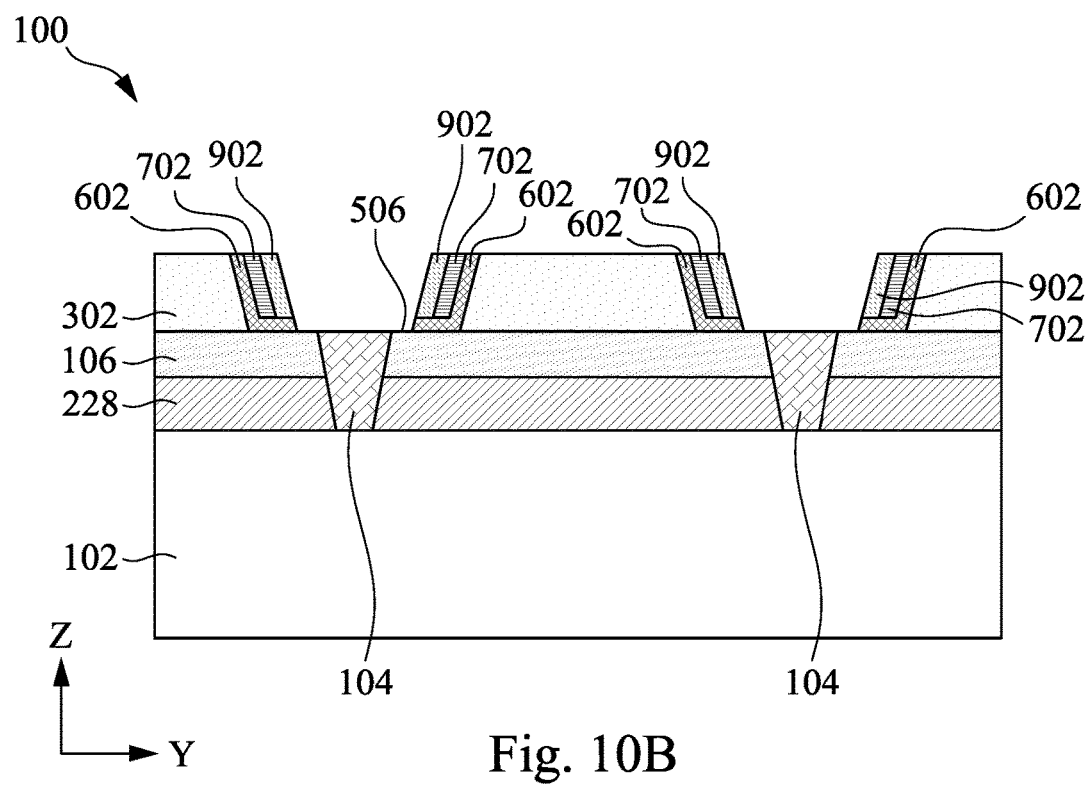

Next, as shown in FIGS. 10A and 10B, portions of the second spacer layer 902 and portions of the first spacer layer 602 are removed. In some embodiments, the portions of the second spacer layer 902 disposed over the top surfaces 503 of the dielectric material 302, the portions of the top surface 506 of the dielectric material 106, and the conductive features 104 are removed, leaving the portions of the second spacer layer 902 adjacent the sidewalls 504 of the dielectric material 302. Portions of the first spacer layer 602 that are disposed on the top surface 503 of the dielectric material 302, the portions of the top surface 506 of the dielectric material 106, and the conductive features 104 are also removed. The removal of the portions of the first spacer layer 602 and the second spacer layer 902 may be performed by any suitable method, such as an etching process. In one example, the etching process is an anisotropic dry etch process. The anisotropic dry etch process removes the portions of the first spacer layer 602 and the second spacer layer 902 disposed on horizontal surfaces but does not remove the portions disposed adjacent the sidewalls 504 of the dielectric material 302. The anisotropic dry etch process may be a selective process that removes the portions of the first spacer layer 602 and second spacer layer 902, while the conductive features 104 and the dielectric material 106 are not removed. As a result, the second spacer layers 902 are adjacent and in contact with the sacrificial spacer layers 702, which are adjacent and in contact with the first spacer layers 602 that are adjacent and in contact with the sidewalls 504 of the dielectric material 302. Furthermore, the second spacer layer 902 and the sacrificial spacer layer 702 are disposed on and in contact with the portion of the first spacer layer 602, which is disposed on and in contact with the top surface 506 of the dielectric material 106, as shown in FIGS. 10A and 10B.

Figure 11A:
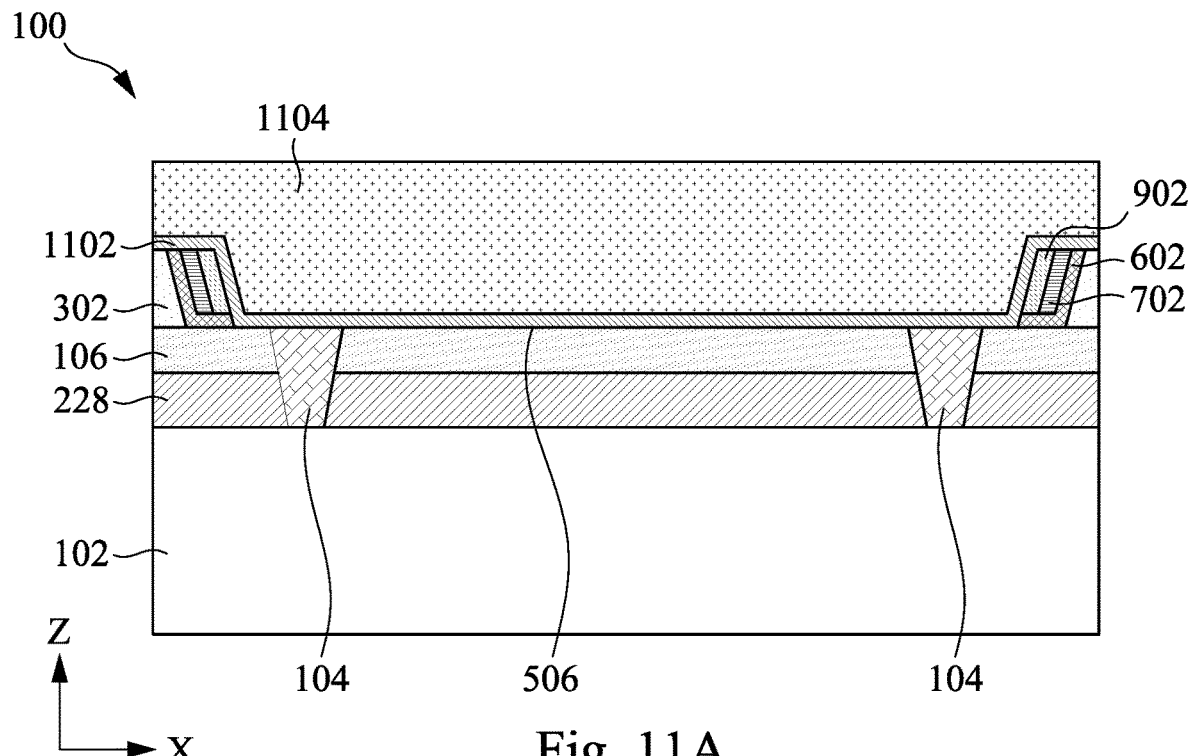
Figure 11B:
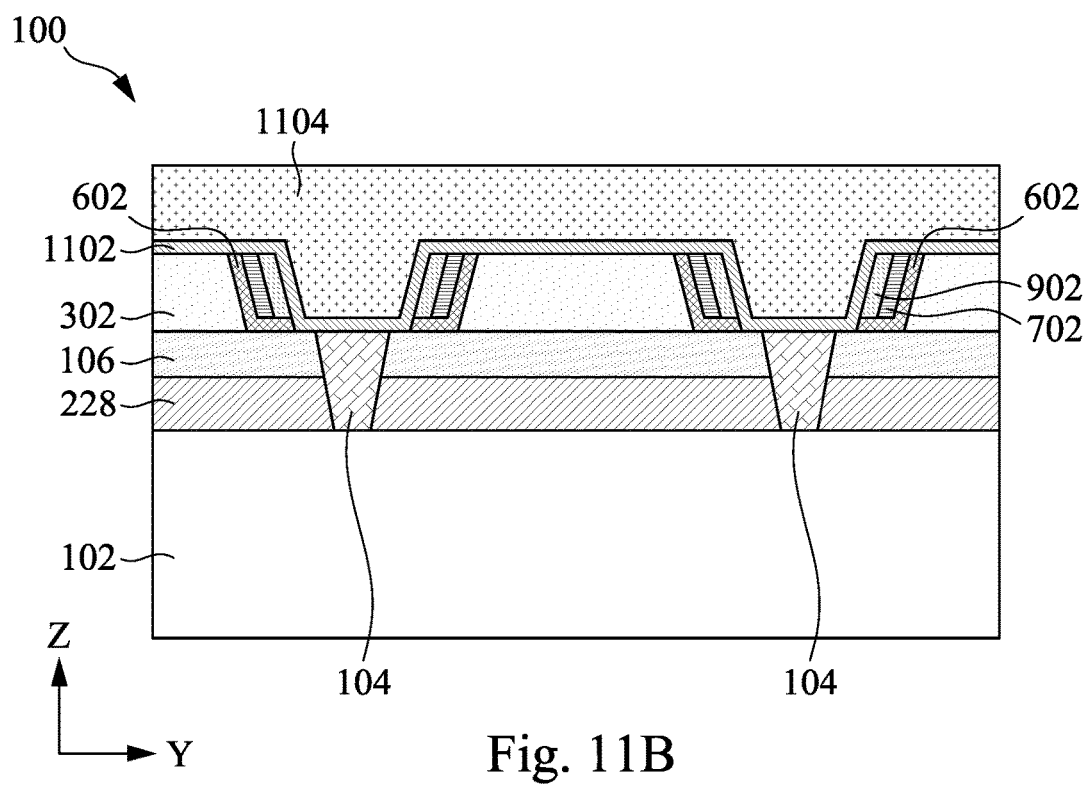

A first barrier layer 1102 is formed on the exposed surfaces of the dielectric material 302, the first spacer layer 602, the sacrificial spacer layer 702, the second spacer layer 902, the dielectric material 106, and the conductive features 104, as shown in FIGS. 11A and 11B. The first barrier layer 1102 may include Co, W, Ru, Al, Mo, Ti, TiN, TiSi, CoSi, NiSi, Cu, TaN, Ni, or TiSiNi. The first barrier layer 1102 may be a single layer or a multilayer structure, such as a two-layer structure or a three-layer structure. In some embodiments, the first barrier layer 1102 may be conformally deposited and may have a thickness ranging from about 0.5 nm to about 10 nm. The first barrier layer 1102 functions as a diffusion barrier layer to prevent a first conductive material 1104 from diffusing into the dielectric material 106. Thus, if the thickness of the first barrier layer 1102 is less than about 0.5 nm, the first barrier layer 1102 may not be sufficient to prevent the diffusion of the first conductive material 1104 into the dielectric material 106. On the other hand, if the thickness of the first barrier layer 1102 is greater than about 10 nm, the manufacturing cost is increased without significant advantage. The first barrier layer 1102 may be formed by any suitable method, such as ALD, CVD or PECVD.

The first conductive material 1104 is formed on the first barrier layer 1102, as shown in FIGS. 11A and 11B. The first conductive material 1104 may include Co, W, Ru, Al, Mo, Ti, TiN, TiSi, CoSi, NiSi, Cu, TaN, Ni, or TiSiNi. The first conductive material 1104 may include the same or different material as the first barrier layer 1102. In some embodiments, the first barrier layer 1102 is not present, and the first conductive material 1104 is formed on the exposed surfaces of the dielectric material 302, the first spacer layer 602, the sacrificial spacer layer 702, the second spacer layer 902, the dielectric material 106, and the conductive features 104.

Figure 12A:
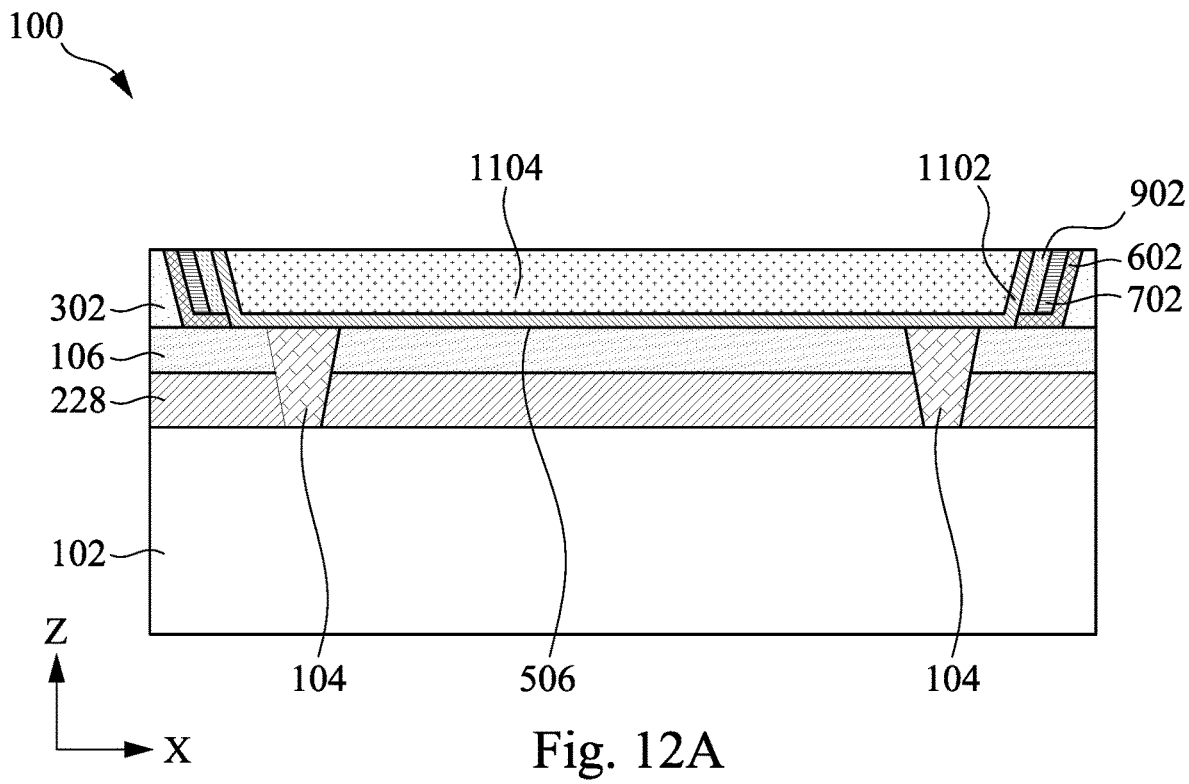
Figure 12B:
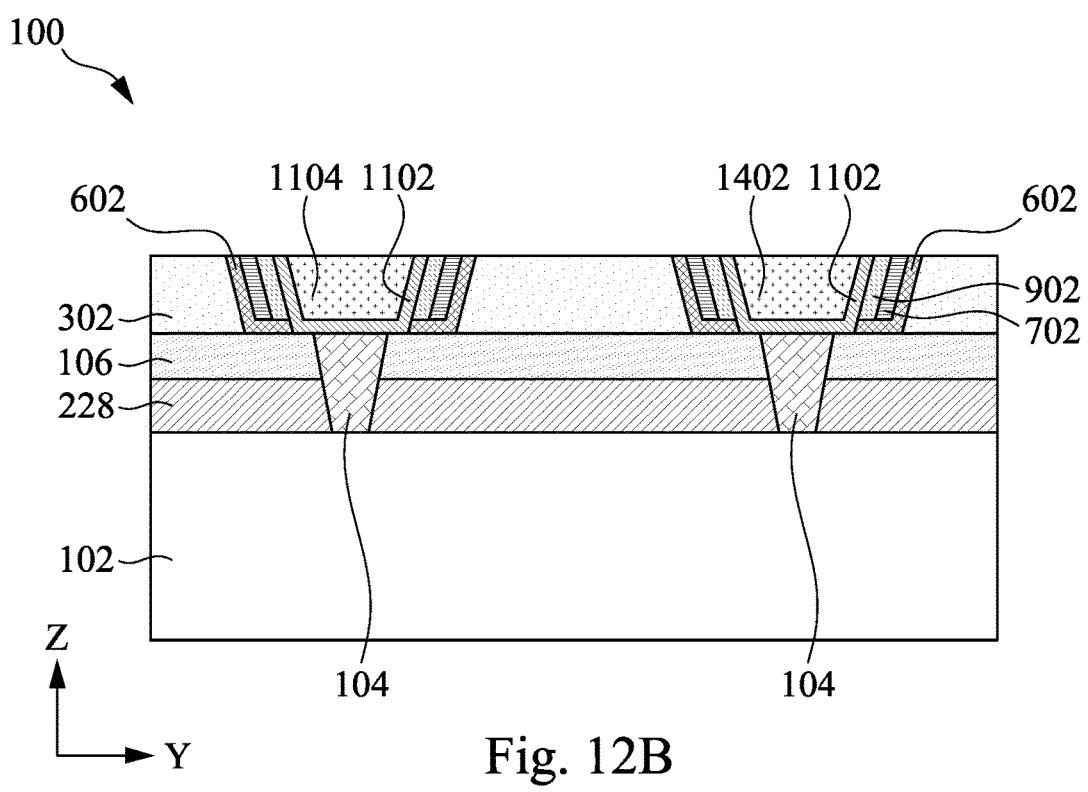

Next, as shown in FIGS. 12A and 12B, a planarization process is performed to expose the dielectric material 302. The planarization process may be any suitable process, such as a chemical mechanical polishing (CMP) process. The planarization process removes portions of the first conductive material 1104 and portions of the first barrier layer 1102 so the first conductive material 1104 is substantially coplanar with the dielectric material 302.

Figure 13A:
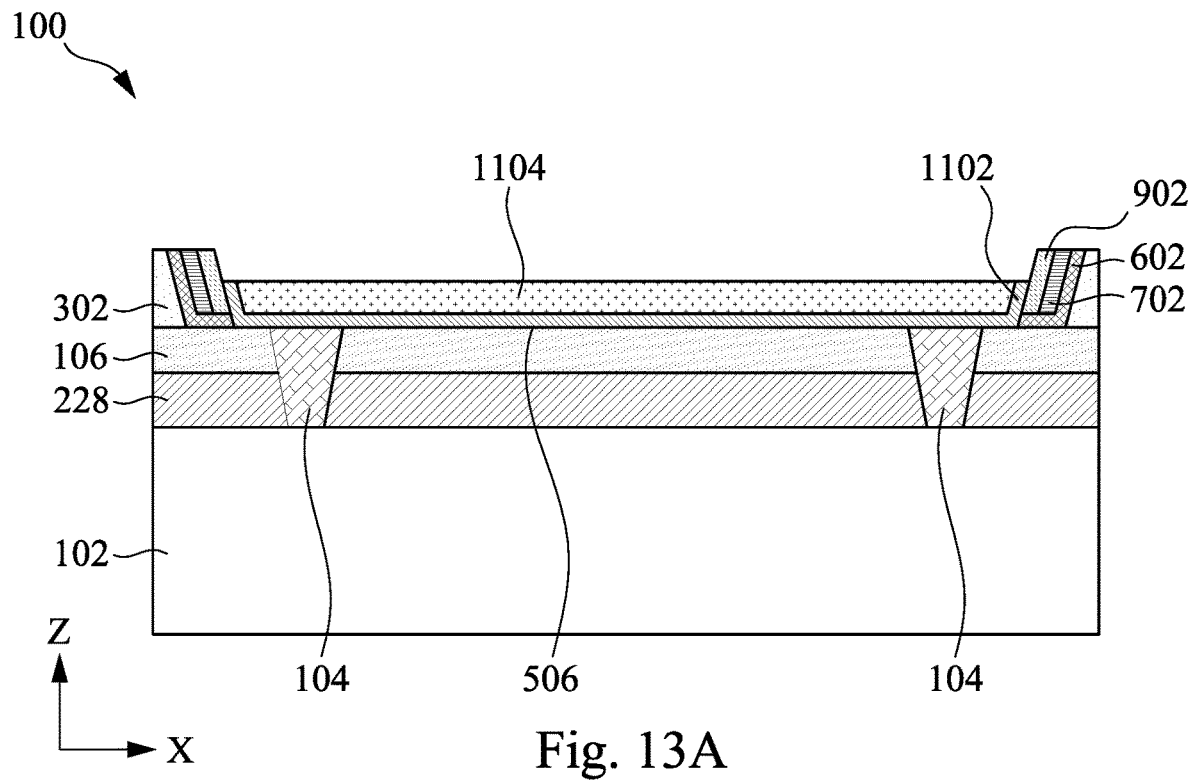
Figure 13B:
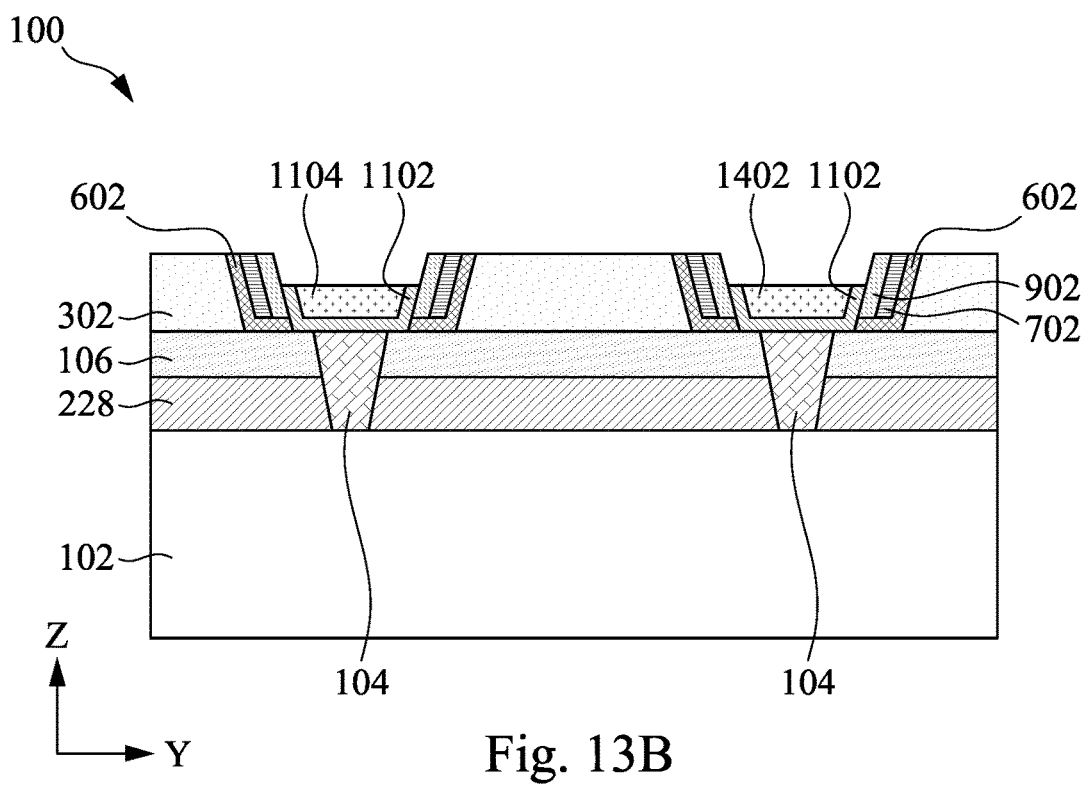

In some embodiments, the first barrier layer 1102 and the first conductive material 1104 are etched back, as shown in FIGS. 13A and 13B. A portion of the first barrier layer 1102 adjacent and in contact with the second spacer layer 902 is removed, and a portion of the second spacer layer 902 is exposed. The thickness of the first conductive material 1104 is reduced, so the openings 502 are partially filled. The etch back of the first barrier layer 1102 and the first conductive material 1104 may be performed by any suitable method, such as dry etching, wet etching, or a combination thereof. In some embodiments, a selective dry etching process is utilized to perform the etch back. The selective dry etching process selectively removes portions of the first barrier layer 1102 and the first conductive material 1104, while the first spacer layer 602, the sacrificial spacer layer 702, the second spacer layer 902, and the dielectric material 302 are not removed.

Figure 14A:
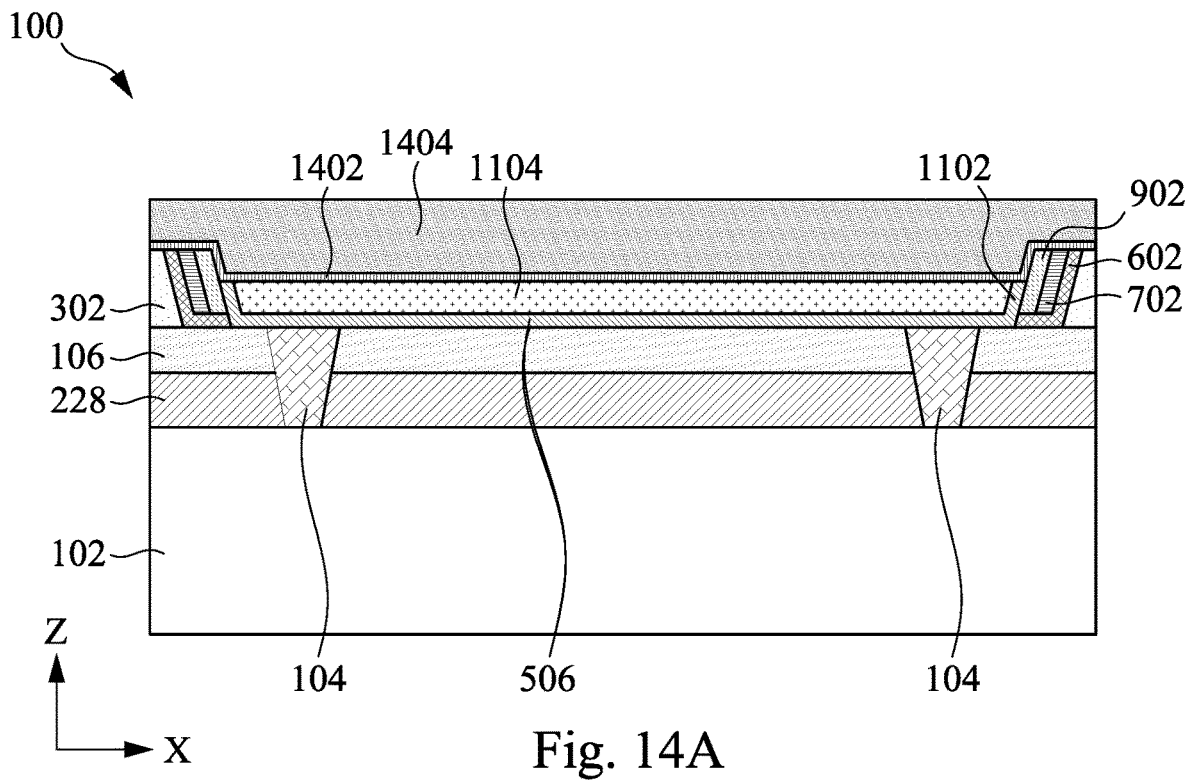
Figure 14B:
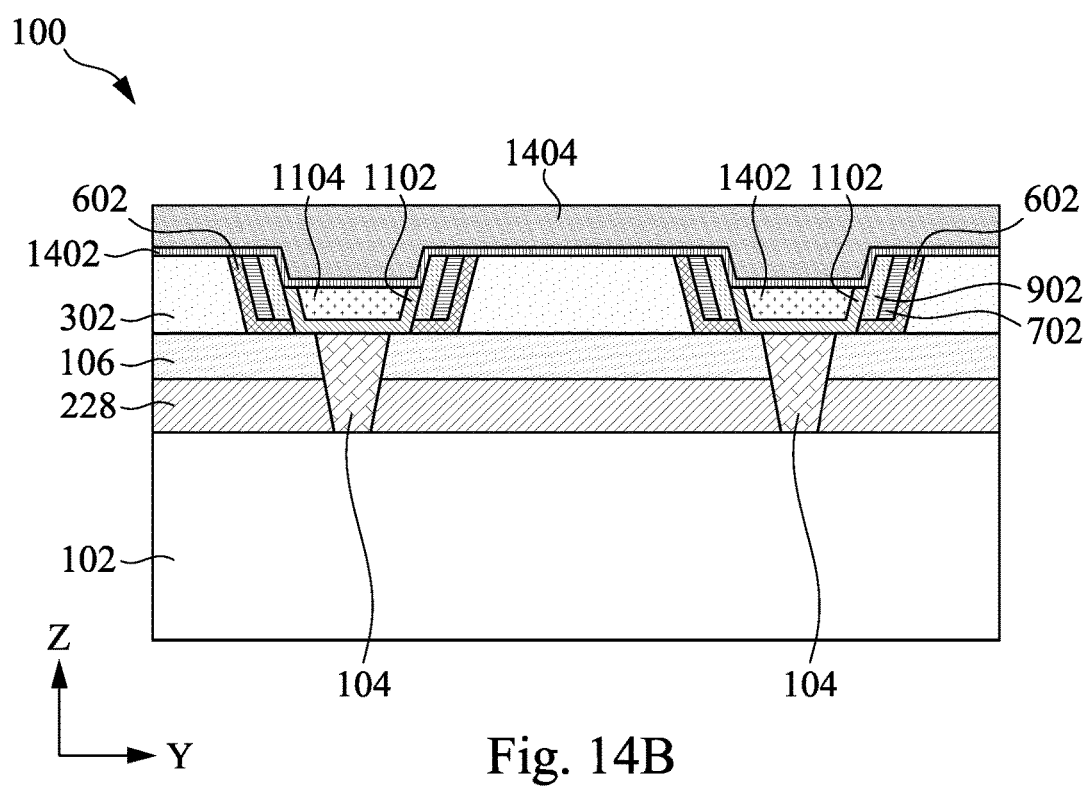

Next, as shown in FIGS. 14A and 14B, a second barrier layer 1402 is formed on the exposed surfaces of the dielectric material 302, the first spacer layer 602, the sacrificial spacer layer 702, the second spacer layer 902, the first barrier layer 1102, and the first conductive material 1104. The second barrier layer 1402 may include Co, W, Ru, Al, Mo, Ti, TiN, TiSi, CoSi, NiSi, Cu, TaN, Ni, or TiSiNi. The second barrier layer 1402 may be a single layer or a multilayer structure, such as a two-layer structure or a three-layer structure. In some embodiments, the second barrier layer 1402 may be conformally deposited and may have a thickness ranging from about 0.5 nm to about 10 nm. The second barrier layer 1402 functions as a diffusion barrier layer to prevent a second conductive material 1404 from diffusing into the second spacer layer 902. Thus, if the thickness of the second barrier layer 1402 is less than about 0.5 nm, the second barrier layer 1402 may not be sufficient to prevent the diffusion of the conductive material 1404 into the second spacer layer 902. On the other hand, if the thickness of the second barrier layer 1402 is greater than about 10 nm, the manufacturing cost is increased without significant advantage. The second barrier layer 1402 may be formed by any suitable method, such as ALD, CVD or PECVD.

The second conductive material 1404 is formed on the second barrier layer 1402, as shown in FIGS. 14A and 14B. The second conductive material 1404 may include Co, W, Ru, Al, Mo, Ti, TiN, TiSi, CoSi, NiSi, Cu, TaN, Ni, or TiSiNi. The second conductive material 1404 may include the same or different material as the second barrier layer 1402. In some embodiments, the second barrier layer 1402 is not present, and the second conductive material 1404 is formed on the exposed surfaces of the dielectric material 302, the first spacer layer 602, the sacrificial spacer layer 702, the second spacer layer 902, the first barrier layer 1102, and the first conductive material 1104.

In some embodiments, the first conductive material 1104 is a metal having a low electrical resistivity, such as copper, and the first conductive material 1104 fills the openings 502 without the second conductive material 1404 (the second conductive material 1404 and the second barrier layer 1402 are not present). However, as the dimensions of features get smaller, materials such as copper may not have good step coverage in the openings 502. Thus, in some embodiments, a conductive material having good step coverage in the openings 502 may be utilized as the first conductive material 1104, and a conductive material having low electrical resistivity may be utilized as the second conductive material 1404. The bottom of the opening 502 has a smaller dimension than the top of the opening 502, thus, the first conductive material 1104 having good step coverage is formed at the bottom of the opening 502 and the second conductive material 1404 having low electrical resistivity is formed at the top of the opening 502. For example, the first conductive material 1104 is TiN and the second conductive material 1404 is Cu. In some embodiments, the thickness of the first conductive material 1104 ranges from about 0.5 nm to about 40 nm, and the thickness of the second conductive material 1404 ranges from about 0.5 nm to about 38 nm. In some embodiments, the second conductive material 1404 does not exist. The thicknesses of the first conductive material 1104 and the second conductive material 1404 may be defined by the thickness of the dielectric material 302.

Next, as shown in FIGS. 15A and 15B, a planarization process is performed to expose the dielectric material 302 and the sacrificial spacer layer 702. The planarization process may be any suitable process, such as a CMP process. The planarization process removes portions of the second conductive material 1404 and portions of the second barrier layer 1402 so the second conductive material 1404 is substantially coplanar with the dielectric material 302. The first barrier layer 1102, the first conductive material 1104, the second barrier layer 1402, and the second conductive material 1404 may be collectively referred to as a conductive structure 1502. The conductive structure 1502 may be a conductive contact, a conductive line, or a conductive via. In some embodiments, the conductive structure 1502 includes the first conductive material 1104 and optionally the first barrier layer 1102, while the second barrier layer 1402 and the second conductive material 1404 are not present.

The sacrificial spacer layers 702 disposed between the first spacer layers 602 and the second spacer layers 902 are removed to form air gaps 1602, as shown in FIGS. 16A and 16B. The removal of the sacrificial spacer layer 702 may be performed by any suitable method, such as an etching process. In one example, the etching process is selective dry etch process that utilizes chlorine or fluorine based etchant. The chlorine or fluorine based etchant selectively removes the sacrificial spacer layer 702, while the first spacer layer 602, the second spacer layer 902, the dielectric material 302, the second barrier layer 1402, and the second conductive material 1404 are not removed. The second spacer layer 902 may function as a structure support for the conductive structure 1502. Without the second spacer layer 902, the conductive structure 1502 may collapse into the air gaps 1602.

The air gap 1602 may have a width defined by the thickness of the sacrificial spacer layer 702. In some embodiments, the air gap 1602 has a width ranging from about 0.5 nm to about 6 nm. Because air gap 1602 is defined by the portion of the sacrificial spacer layer 702 disposed adjacent the portion of the first spacer layer 602, which is disposed on the sidewall 504 of the dielectric material 302, the air gap 1602 also forms the acute angel A with respect to the top surface 506 of the dielectric material 106. As shown in FIGS. 16A and 16B, the first spacer layer 602 includes a first portion 1604 disposed on the sidewall 504 of the dielectric material 302 and a second portion 1606 disposed on the dielectric material 106. The second spacer layer 902 is disposed on the second portion 1606 of the first spacer layer 602. The air gap 1602 is disposed between the second spacer layer 902 and the first portion 1604 of the first spacer layer 602.

Figure 17:
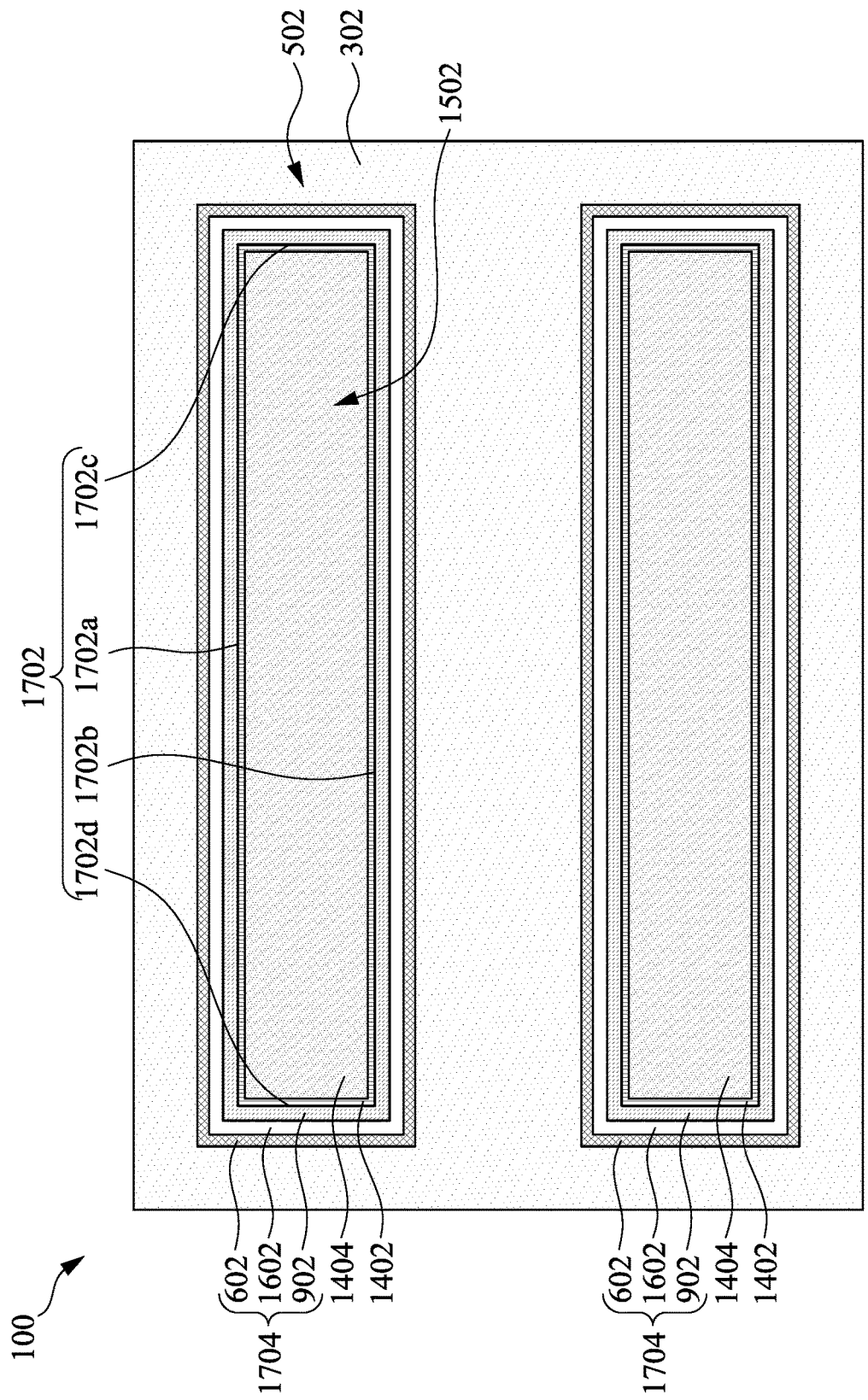
FIG. 17 is a top view of the semiconductor device structure at the manufacturing stage as shown in FIGS. 16A and 16B, in accordance with some embodiments.

FIG. 17 is a top view of the semiconductor device structure 100 at the manufacturing stage as shown in FIGS. 16A and 16B, in accordance with some embodiments. As shown in FIG. 17, the conductive structures 1502 are disposed in the openings 502. The conductive structure 1502 has a sidewall 1702. The sidewall 1702 may include one or more surfaces based on the shape of the conductive structure 1502. In some embodiments, the sidewall 1702 includes a continuous surface. In some embodiments, the sidewall 1702 includes a plurality of surfaces. For example, the conductive structure 1502 is a conductive line, and the sidewall 1702 includes a first surface 1702a, a second surface 1702b opposite the first surface 1702a, a third surface 1702c connecting the first surface 1702a and the second surface 1702b, and a fourth surface 1702d opposite the third surface 1702c. The second spacer layer 902 surrounds the sidewall 1702 of the conductive structure 1502, the air gap 1602 surrounds the second spacer layer 902, and the first spacer layer 602 surrounds the air gap 1602. As shown in FIG. 17, the air gap 1602 is a continuous air gap that surrounds the sidewall 1702, such as the first, second, third, and fourth surfaces 1702a-d, of the conductive structure 1502. The first spacer layer 602, the air gap 1602, and the second spacer layer 902 may be collectively referred to as a surrounding structure 1704. The surrounding structure 1704 is disposed in the opening 502 and surrounds the sidewall 1702 of the conductive structure 1502. For example, the surrounding structure 1704 may surround the first surface 1702a, the second surface 1702b, the third surface 1702c, and the fourth surface 1702d of the conductive structure 1502. In some embodiments, the surrounding structure 1704 includes the first spacer layer 602 and the second spacer layer 902 adjacent the first spacer layer 602, and the air gap 1602 is between the first spacer layer 602 and the second spacer layer 902. The surrounding structure 1704 includes the air gap 1602, which has a lower k value compared to the materials of the first spacer layer 602 and the second spacer layer 902, leading to reduced capacitive coupling between neighboring conductive structures.

Figure 18A:
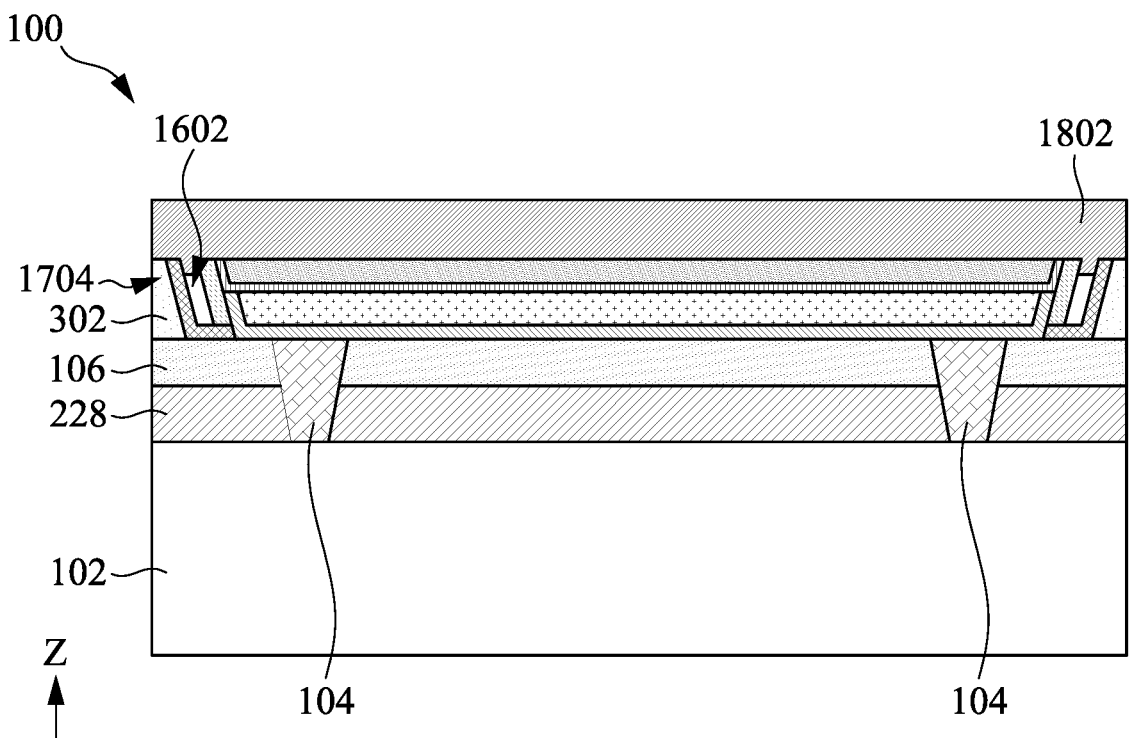
Figure 18B:
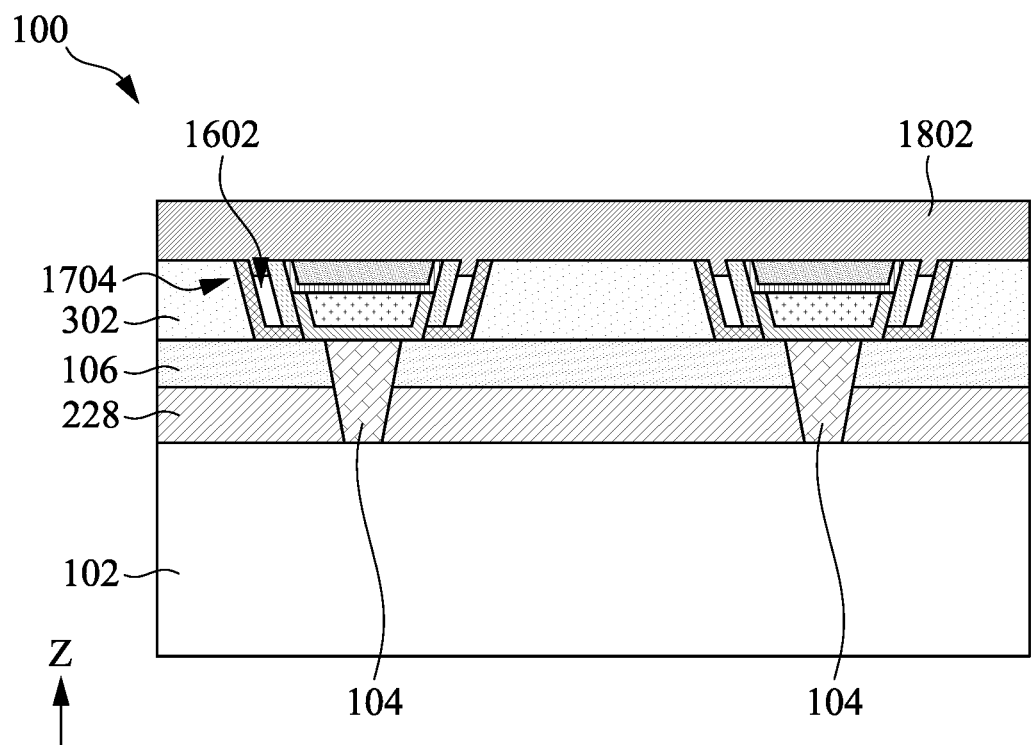

FIGS. 18A-20A are cross-sectional side views of various stages of manufacturing the semiconductor device structure 100 taken along line A-A of FIG. 1, in accordance with some embodiments. FIGS. 18B-20B are cross-sectional side views of various stages of manufacturing the semiconductor device structure 100 taken along line B-B of FIG. 1, in accordance with some embodiments. As shown in FIGS. 18A and 18B, after the formation of the air gaps 1602, a seal material 1802 is formed on the dielectric material 302, the surrounding structure 1704, and the conductive structure 1502. The sealing material 1802 may also seal the air gaps 1602 by partially filling the air gaps 1602. The sealing material 1802 is disposed over the air gap 1602 and between the first portion 1604 of the first spacer layer 602 and the second spacer layer 902. The sealing material 1802 does not completely fill the air gaps 1602 due to the small opening (i.e., the width of the air gap 1602) of the air gap 1602. The sealing material 1802 may include SiC, LaO, AlO, AlON, ZrO, HfO, SiN, ZnO, ZrN, ZrAlO, TiO, TaO, YO, TaCN, ZrSi, SiOCN, SiOC, SiCN, HfSi, or SiO. The sealing material 1802 may include the same or different material as the first spacer layer 602. The sealing material 1802 may be formed by any suitable method, such as CVD.

Figure 19A:
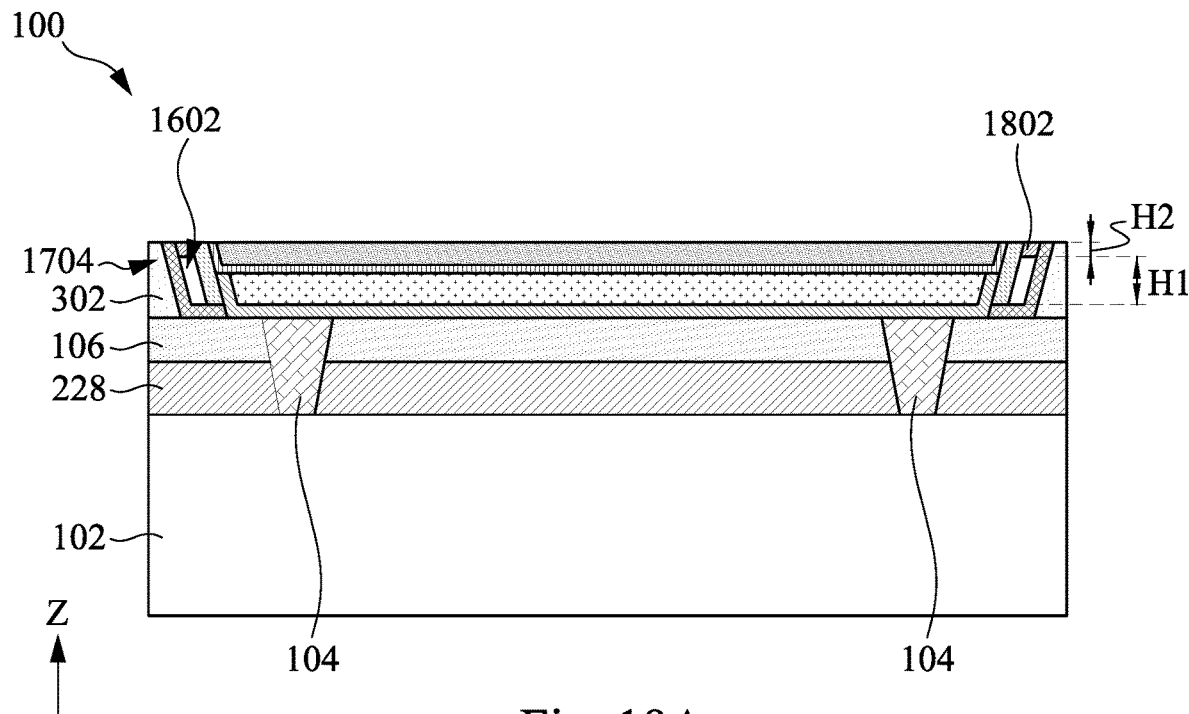
Figure 19B:
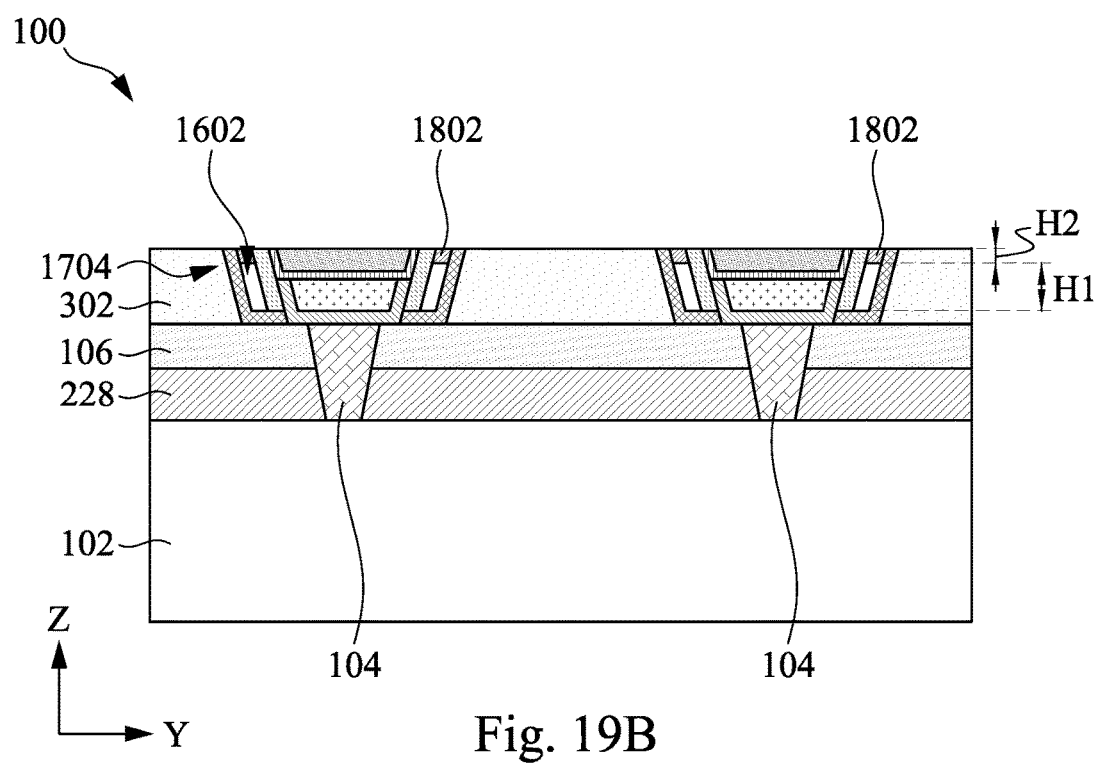

Next, as shown in FIGS. 19A and 19B, a planarization process is performed to expose the dielectric material 302. The planarization process may be any suitable process, such as a CMP process. The planarization process removes portions of the sealing material 1802 so the second conductive material 1404 is substantially coplanar with the dielectric material 302. As described above, the sealing material 1802 partially fills the air gap 1602. As a result, the air gap 1602 has a height H1 ranging from about 1 nm to about 39 nm, and the sealing material 1802 has a height H2 ranging from about 0.5 nm to about 5 nm. The sealing material 1802 seals the air gap 1602 to prevent the air gap 1602 from being filled by any material formed over the air gap 1602. Thus, if the height H2 is less than about 0.5 nm, the sealing material 1802 may not be sufficient to seal the air gap 1602. On the other hand, if the height H2 is greater than about 5 nm, the dimensions of the air gap 1602 may be too small to provide improved electrical isolation between neighboring conductive structures 1502.

Figure 20A:
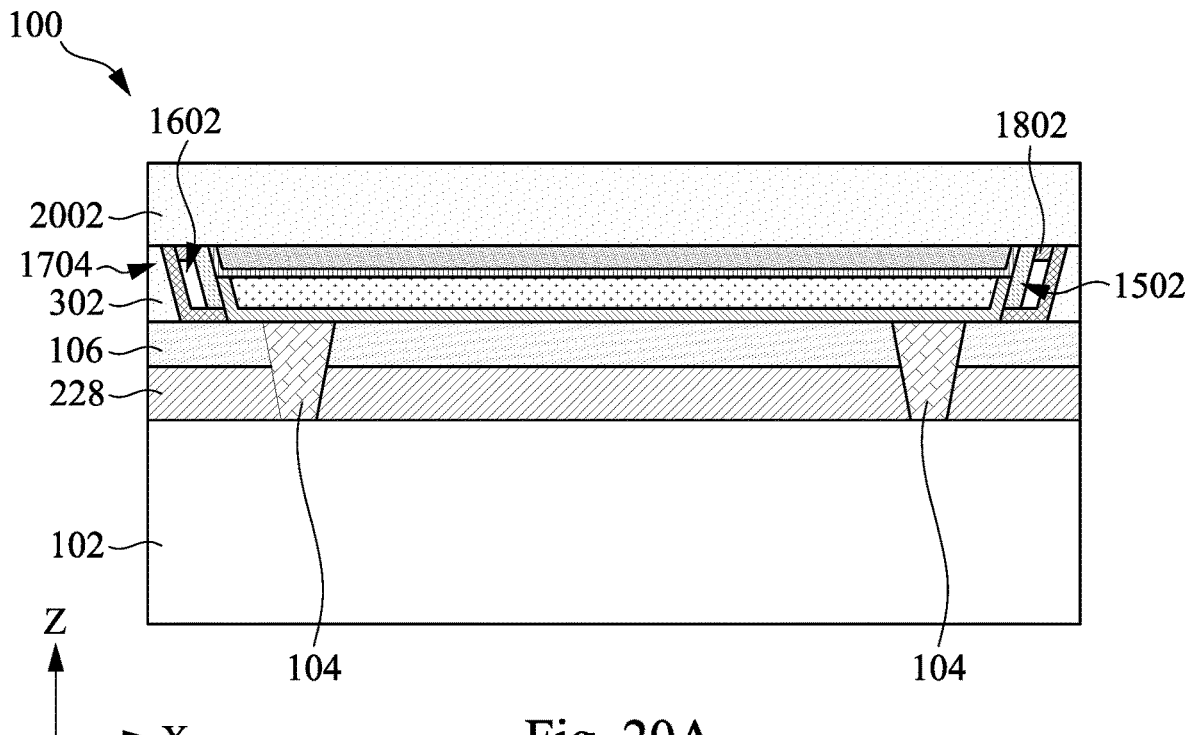
Figure 20B:
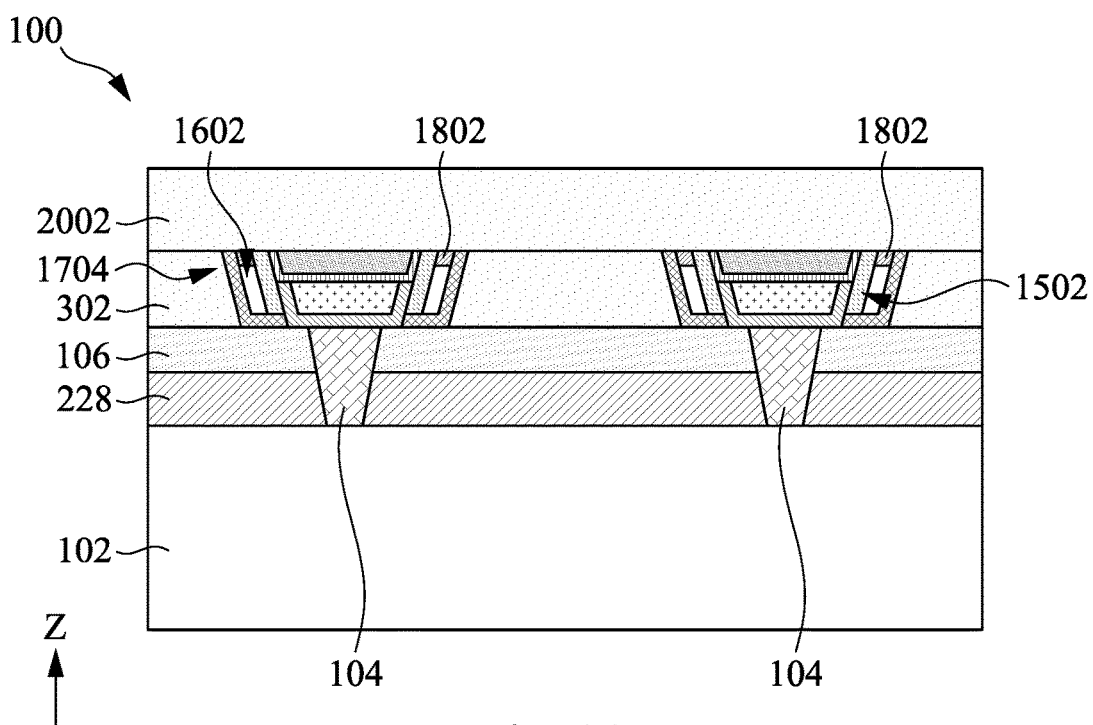

A dielectric material 2002 is formed on the dielectric material 302, the surrounding structure 1704, the conductive structure 1502, and the sealing material 1802, as shown in FIGS. 20A and 20B. The dielectric material 2002 may be a third ILD layer. The dielectric material 2002 may include SiC, LaO, AlO, AlON, ZrO, HfO, SiN, ZnO, ZrN, ZrAlO, TiO, TaO, YO, TaCN, ZrSi, SiOCN, SiOC, SiCN, HfSi, or SiO. The dielectric material 2002 may include the same or different material as the dielectric material 302. The dielectric material 2002 may have a thickness ranging from about 1 nm to about 40 nm and may be formed by any suitable method, such as CVD or PECVD. In some embodiments, the sealing material 1802 includes the same material as the dielectric material 2002, and the sealing material 1802 may function as the third ILD layer. In such embodiments, the planarization process described in FIGS. 19A and 19B and the deposition of the dielectric material 2002 described in FIGS. 20A and 20B are skipped. Conductive structures (not shown) may be formed in the dielectric material 2002 to connect to the conductive structures 1502.

The present disclosure provides a semiconductor device structure 100 including a device 202, a conductive structure 1502 disposed above the device 202, and a surrounding structure 1704 surrounding a sidewall 1702 of the conductive structure 1502. The surrounding structure 1704 includes a first spacer layer 602 and a second spacer layer 902 separated from the first spacer layer 602 by an air gap 1602. Some embodiments may achieve advantages. For example, the conductive features 104 disposed below the conductive structure 1502 may be protected by a portion of the first spacer layer 602 that was subsequently removed. The second spacer layer 902 may provide structural support to the conductive structure 1502. The air gap 1602 has the lowest k value compared to the first and second spacer layers 602, 902, which reduces capacitive coupling between neighboring conductive structures 1502.

An embodiment is a semiconductor device structure. The semiconductor device structure includes a device, a first dielectric material disposed over the device, and an opening is formed in the first dielectric material. The semiconductor device structure further includes a conductive structure disposed in the opening, and the conductive structure includes a first sidewall. The semiconductor device structure further includes a surrounding structure disposed in the opening, and the surrounding structure surrounds the first sidewall of the conductive structure. The surrounding structure includes a first spacer layer and a second spacer layer adjacent the first spacer layer. The first spacer layer is separated from the second spacer layer by an air gap.

Another embodiment is a semiconductor device structure. The semiconductor device structure includes a device, a first dielectric material disposed over the device, a first conductive feature disposed in the first dielectric material, and a second dielectric material disposed over the first dielectric material. The second dielectric material has an opening formed therein, and the opening is defined by a first sidewall of the second dielectric material. The semiconductor device structure further includes a conductive structure disposed in the opening and a surrounding structure disposed in the opening. The surrounding structure includes a first spacer layer including a first portion and a second portion. The first portion of the first spacer layer is disposed on the first sidewall of the second dielectric material, and the second portion of the first spacer layer is disposed on the first dielectric material. The surrounding structure further includes a second spacer layer disposed on the second portion of the first spacer layer. An air gap is formed between the first portion of the first spacer layer and the second spacer layer.

A further embodiment is a method. The method includes forming a device over a substrate, forming a conductive feature over the device, forming a first dielectric material over the device, and forming an opening in the first dielectric material to expose the conductive feature. The opening is defined by a first sidewall of the first dielectric material. The method further includes forming a first spacer layer on the conductive feature and the first sidewall of the first dielectric material, and the first spacer layer includes a first portion and a second portion. The first portion is in contact with the first sidewall of the first dielectric material. The method further includes forming a sacrificial spacer layer on the first spacer layer and removing a portion of the sacrificial spacer layer to expose the second portion of the first spacer layer. A remaining portion of the sacrificial spacer layer is in contact with the first portion of the first spacer layer. The method further includes forming a second spacer layer on the exposed second portion of the first spacer layer and the remaining portion of the sacrificial layer and forming a conductive structure in the opening. The conductive structure includes a second sidewall. The method further includes removing the remaining portion of the sacrificial spacer layer to form an air gap, and the air gap surrounds the second sidewall of the conductive structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for forming a semiconductor device structure, comprising:
    forming a device over a substrate;
    forming a conductive feature over the device;
    forming a first dielectric material over the device;
    forming an opening in the first dielectric material to expose the conductive feature, wherein the opening is defined by a first sidewall of the first dielectric material;
    forming a first spacer layer on the conductive feature and the first sidewall of the first dielectric material, wherein the first spacer layer comprises a first portion and a second portion, and the first portion is in contact with the first sidewall of the first dielectric material;
    forming a sacrificial spacer layer on the first spacer layer;
    removing a portion of the sacrificial spacer layer to expose the second portion of the first spacer layer, wherein a remaining portion of the sacrificial spacer layer is in contact with the first portion of the first spacer layer;
    forming a second spacer layer on the exposed second portion of the first spacer layer and the remaining portion of the sacrificial spacer layer;
    forming a conductive structure in the opening, wherein the conductive structure includes a second sidewall; and
    removing the remaining portion of the sacrificial spacer layer to form an air gap, wherein the air gap surrounds the second sidewall of the conductive structure.

2. The method of claim 1, wherein the forming the conductive structure comprises forming a first barrier layer in the opening and forming a first conductive material on the first barrier layer.

3. The method of claim 2, wherein the forming the conductive structure further comprises removing a portion of the first barrier layer and a portion of the first conductive material.

4. The method of claim 3, wherein the forming the conductive structure further comprises forming a second barrier layer on the first barrier layer and the first conductive material and forming a second conductive material on the second barrier layer.

5. The method of claim 1, further comprising forming a sealing material over the air gap and between the first portion of the first spacer layer and the second spacer layer.

6. A method for forming a semiconductor device structure, comprising:
forming a first dielectric material on a second dielectric material over a substrate;
forming an opening in the first dielectric material, wherein the opening is defined by a first sidewall of the first dielectric material;
forming a first spacer layer on the first sidewall of the first dielectric material and the second dielectric material, wherein the first spacer layer comprises a first portion and a second portion, and the first portion is in contact with the first sidewall of the first dielectric material;
forming a sacrificial spacer layer on the first spacer layer;
removing a portion of the sacrificial spacer layer to expose the second portion of the first spacer layer, wherein a remaining portion of the sacrificial spacer layer is in contact with the first portion of the first spacer layer;
forming a second spacer layer on the exposed second portion of the first spacer layer and the remaining portion of the sacrificial spacer layer;
forming a conductive structure in the opening, wherein the conductive structure includes a second sidewall; and
removing the remaining portion of the sacrificial spacer layer to form an air gap, wherein the air gap surrounds the second sidewall of the conductive structure.

7. The method of claim 6, wherein the portion of the sacrificial spacer layer is removed by an anisotropic dry etch process.

8. The method of claim 6, further comprising removing portions of the second spacer layer and portions of the first spacer layer before forming the conductive structure.

9. The method of claim 8, wherein the portions of the second spacer layer and the portions of the first spacer layer are removed by an anisotropic dry etch process.

10. The method of claim 9, further comprising forming a conductive feature in the second dielectric material, wherein the removing of the portions of the second spacer layer and the portions of the first spacer layer exposes the conductive feature.

11. The method of claim 10, wherein the conductive structure is formed on the conductive feature.

12. The method of claim 6, wherein the forming the conductive structure comprises forming a first barrier layer in the opening and forming a first conductive material on the first barrier layer.

13. The method of claim 12, wherein the forming the conductive structure further comprises removing a portion of the first barrier layer and a portion of the first conductive material.

14. The method of claim 13, wherein the forming the conductive structure further comprises forming a second barrier layer on the first barrier layer and the first conductive material and forming a second conductive material on the second barrier layer.

15. The method of claim 6, further comprising forming a sealing material over the air gap and between the first portion of the first spacer layer and the second spacer layer.

16. A method for forming a semiconductor device structure, comprising:
forming a first dielectric material on a second dielectric material over a substrate;
forming an opening in the first dielectric material, wherein the opening is defined by a first sidewall of the first dielectric material, wherein a portion of the second dielectric material is exposed in the opening;
forming a first spacer layer on the first sidewall of the first dielectric material and a portion of the exposed portion of the second dielectric material, wherein the first spacer layer comprises a first portion and a second portion, the first portion is in contact with the first sidewall of the first dielectric material, and the second portion is in contact with the portion of the exposed portion of the second dielectric material;
forming a sacrificial spacer layer in contact with the first portion and the second portion of the first spacer layer;
forming a second spacer layer in contact with the sacrificial spacer layer and the second portion of the first spacer layer;
forming a conductive structure in the opening, wherein the conductive structure includes a second sidewall; and
removing the sacrificial spacer layer to form an air gap, wherein the air gap surrounds the second sidewall of the conductive structure.

17. The method of claim 16, wherein the forming the conductive structure comprises forming a first barrier layer in contact with the first portion of the first spacer layer, the sacrificial spacer layer, and the second spacer layer.

18. The method of claim 17, wherein the forming the conductive structure further comprises forming a first conductive material on the first barrier layer.

19. The method of claim 18, further comprising performing a planarization process to remove a portion of the first barrier layer and a portion of the first conductive material to expose the first dielectric material.

20. The method of claim 16, further comprising forming a sealing material over the air gap and between the first portion of the first spacer layer and the second spacer layer.

* * * * *